US011069870B2

(12) United States Patent
Gruen

(10) Patent No.: US 11,069,870 B2
(45) Date of Patent: Jul. 20, 2021

(54) HIGH EFFICIENCY GRAPHENE/WIDE BAND-GAP SEMICONDUCTOR HETEROJUNCTION SOLAR CELLS

(71) Applicant: Dimerond Technologies, LLC, Downers Grove, IL (US)

(72) Inventor: Dieter M. Gruen, Downers Grove, IL (US)

(73) Assignee: Dimerond Technologies, LLC, Downers Grove, IL (US)

( * ) Notice: Subject to any disclaimer, the term of this patent is extended or adjusted under 35 U.S.C. 154(b) by 0 days.

(21) Appl. No.: 17/028,035

(22) Filed: Sep. 22, 2020

(65) Prior Publication Data

US 2021/0005833 A1   Jan. 7, 2021

Related U.S. Application Data

(63) Continuation of application No. 16/890,005, filed on Jun. 2, 2020, now Pat. No. 10,833,285.

(60) Provisional application No. 62/937,938, filed on Nov. 20, 2019, provisional application No. 62/924,805, filed on Oct. 23, 2019, provisional application No. 62/856,698, filed on Jun. 3, 2019.

(51) Int. Cl.
*H01L 51/42* (2006.01)
*H01L 51/44* (2006.01)
*H01L 51/00* (2006.01)

(52) U.S. Cl.
CPC ...... *H01L 51/4266* (2013.01); *H01L 51/0045* (2013.01); *H01L 51/442* (2013.01)

(58) Field of Classification Search
CPC ............. H01L 51/4266; H01L 51/0045; H01L 51/442
See application file for complete search history.

(56) References Cited

U.S. PATENT DOCUMENTS

| 3,988,166 A | 10/1976 | Beam |
| 4,559,901 A | 12/1985 | Morimoto |
| 4,629,631 A | 12/1986 | Dearnaley |
| 4,634,600 A | 1/1987 | Shimizu |
| 4,663,305 A | 5/1987 | Mauldin |
| 5,132,105 A | 7/1992 | Remo |

(Continued)

FOREIGN PATENT DOCUMENTS

| JP | 2007081097 A | 3/2007 |
| KR | 20110040254 A | 4/2011 |

(Continued)

OTHER PUBLICATIONS

"Superconductivity at 28.6 K in a Rubidium-C.sub.60 Fullerene Compound, Rb.sub.x C.sub.60, Synthesized by a Solution-Phase Technique"; Amer. Chem. Soc. 0020-1669/1330-2962.

(Continued)

*Primary Examiner* — Matthew T Martin
(74) *Attorney, Agent, or Firm* — Fitch, Even, Tabin & Flannery, LLP

(57) ABSTRACT

A photovoltaic solar cell apparatus is described herein combining the advantages of several discoveries that address the previously unsolved problem of creating high conversion efficiency solar cells at a low cost. The solar cell designs and underlying principals disclosed herein may be applied in any type of photovoltaic solar power application, such as large scale photovoltaic solar plants, rooftop panels, solar powered electronic devices, and many others.

27 Claims, 11 Drawing Sheets

(56) References Cited

U.S. PATENT DOCUMENTS

| | | |
|---|---|---|
| 5,209,916 A | 5/1993 | Gruen |
| 5,273,788 A | 12/1993 | Yu |
| 5,308,661 A | 5/1994 | Feng |
| 5,328,676 A | 7/1994 | Gruen |
| 5,370,855 A | 12/1994 | Gruen |
| 5,462,776 A | 10/1995 | Gruen |
| 5,698,328 A | 12/1997 | Bunshah |
| 5,772,760 A | 6/1998 | Gruen |
| 5,894,058 A | 4/1999 | Hatakeyama |
| 6,007,969 A | 12/1999 | Hatakeyama |
| 6,010,831 A | 1/2000 | Hatakeyama |
| 6,020,677 A | 2/2000 | Blanchet-Fincher |
| 6,048,671 A | 4/2000 | Hatakeyama |
| 6,183,818 B1 | 2/2001 | Vohra |
| 6,313,392 B1 | 11/2001 | Sato |
| 6,534,923 B2 | 3/2003 | Espinosa |
| 6,592,839 B2 | 7/2003 | Gruen |
| 6,669,996 B2 | 12/2003 | Ueno |
| 6,781,294 B2 | 8/2004 | Sakai |
| 6,783,589 B2 | 8/2004 | Dahl |
| 6,791,108 B1 | 9/2004 | Olivas |
| 6,882,094 B2 | 4/2005 | Dimitrijevic |
| 6,952,075 B2 | 10/2005 | Sakai |
| 7,127,286 B2 | 10/2006 | Mech |
| 7,224,532 B2 | 5/2007 | Dahl |
| 7,259,320 B2 | 8/2007 | Take |
| 7,309,446 B1 | 12/2007 | Kley |
| 7,309,476 B2 | 12/2007 | Carlson |
| 7,312,562 B2 | 12/2007 | Dahl |
| 7,312,582 B2 | 12/2007 | Newman, Jr. |
| 7,572,332 B2 | 8/2009 | Gruen |
| 7,718,000 B2 | 5/2010 | Gruen |
| 7,999,176 B2 | 8/2011 | Flood |
| 8,257,494 B2 | 9/2012 | Gruen |
| 8,586,999 B1 | 11/2013 | Gruen |
| 8,829,331 B2 | 9/2014 | Gruen |
| 8,835,285 B2 | 9/2014 | Grimes |
| 9,040,395 B2 | 5/2015 | Gruen |
| 2002/0163414 A1 | 11/2002 | Mayer |
| 2003/0152700 A1 | 8/2003 | Asmussen |
| 2003/0188637 A1 | 10/2003 | Ito |
| 2003/0199710 A1 | 10/2003 | Liu |
| 2003/0221717 A1 | 12/2003 | Dessel |
| 2003/0226423 A1 | 12/2003 | Liao |
| 2004/0016397 A1 | 1/2004 | Carlson |
| 2004/0109328 A1 | 6/2004 | Dahl |
| 2004/0198048 A1 | 10/2004 | Dahl |
| 2004/0198049 A1 | 10/2004 | Dahl |
| 2004/0221795 A1 | 11/2004 | Scarsbrook |
| 2004/0221796 A1 | 11/2004 | Swain |
| 2004/0227138 A1 | 11/2004 | Dahl |
| 2004/0227195 A1 | 11/2004 | Chang |
| 2004/0247515 A1 | 12/2004 | Gardner |
| 2004/0251478 A1 | 12/2004 | Dahl |
| 2005/0008560 A1 | 1/2005 | Kataoka |
| 2005/0019114 A1 | 1/2005 | Sung |
| 2005/0019576 A1 | 1/2005 | Dahl |
| 2005/0168122 A1 | 8/2005 | Dahl |
| 2005/0200260 A1 | 9/2005 | Swain |
| 2005/0233489 A1 | 10/2005 | Nishikawa |
| 2005/0275330 A1 | 12/2005 | Sung |
| 2006/0121279 A1 | 6/2006 | Petrik |
| 2006/0207647 A1 | 9/2006 | Tsakalakos |
| 2006/0222850 A1 | 10/2006 | Xiao |
| 2006/0261719 A1 | 11/2006 | Fox |
| 2006/0269467 A1 | 11/2006 | Khabashesku |
| 2006/0269567 A1 | 11/2006 | Yuen |
| 2007/0082200 A1 | 4/2007 | Gruen |
| 2007/0126312 A1 | 6/2007 | Sung |
| 2007/0137684 A1 | 6/2007 | Gruen |
| 2007/0146910 A1 | 6/2007 | Duston |
| 2007/0187153 A1 | 8/2007 | Bertagnolli |
| 2007/0232074 A1 | 10/2007 | Ravi |
| 2008/0063888 A1 | 3/2008 | Sumant |
| 2008/0087314 A1 | 4/2008 | Xiao |
| 2008/0226840 A1 | 9/2008 | Asmussen |
| 2009/0004092 A1 | 1/2009 | Dolmatov |
| 2009/0017258 A1 | 1/2009 | Carlisle |
| 2009/0042029 A1 | 2/2009 | Havel |
| 2009/0057649 A1 | 3/2009 | Sutter |
| 2009/0092824 A1 | 4/2009 | Gruen |
| 2009/0242016 A1 | 10/2009 | Zach |
| 2010/0101621 A1 | 4/2010 | Xu |
| 2010/0253184 A1 | 10/2010 | Choi |
| 2010/0279426 A1 | 11/2010 | Tour |
| 2010/0330421 A1 | 12/2010 | Cui |
| 2011/0083737 A1 | 4/2011 | Nishino |
| 2011/0096218 A1 | 4/2011 | Bratkovski |
| 2011/0200825 A1 | 8/2011 | Chakraborty |
| 2011/0209744 A1 | 9/2011 | Hu |
| 2012/0034464 A1 | 2/2012 | Chakraborty |
| 2012/0097217 A1 | 4/2012 | Yin |
| 2012/0102843 A1 | 5/2012 | Chakraborty |
| 2012/0132256 A1 | 5/2012 | Sager |
| 2012/0192920 A1 | 8/2012 | McCowan |
| 2012/0227787 A1 | 9/2012 | Drori |
| 2012/0312343 A1 | 12/2012 | VanVechten |
| 2013/0001516 A1 | 1/2013 | Hebard |
| 2013/0019932 A1 | 1/2013 | Jung |
| 2013/0040204 A1 | 2/2013 | Liu |
| 2013/0045418 A1 | 2/2013 | Oguni |
| 2013/0099196 A1 | 4/2013 | Wu |
| 2013/0149860 A1 | 6/2013 | Dasgupta |
| 2013/0206199 A1 | 8/2013 | Lassiter |
| 2014/0041711 A1 | 2/2014 | Gruen |
| 2015/0194549 A1 | 7/2015 | Weman |
| 2015/0303332 A1 | 10/2015 | Chang |
| 2016/0204283 A1 | 7/2016 | Patolsky |

FOREIGN PATENT DOCUMENTS

| | | |
|---|---|---|
| KR | 20110056744 A | 5/2011 |
| WO | 2007127727 A2 | 11/2007 |
| WO | 2010053997 A1 | 5/2010 |
| WO | 2010132868 A1 | 11/2010 |

OTHER PUBLICATIONS

"Silicon Carbide High-Temperature Power Rectifiers Fabricated and Characterized," http://www.grc.nasa.gov/WWW/RT/RT1995/2000/2510n.htm; Jan. 23, 2013.

A. Das, S. Pisana, B. Chakraborty, S. Piscanec, S. K. Saha, U. . Waghmare, K. S. Novoselov, H. R. Krishnamurthy, A. K. Geim, A. C. Ferrari, A. K. Sood, "Monitoring Dopants By Raman Scattering In An Electrochemically Top-Gated Graphene Transistor," Nature Nanotechnology, 3, pp. 210-215 (2008).

Angus, John C. et al; "Metastable Growth of Diamond and Diamond-Like Phases"; Annu. Rev. Mater. Sci. 1991. 21:221-48.

B. Liu and E.S. Aydil, "Growth of Oriented Single-Crystalline Rutile TiO2 Nanorods on Transparent Conducting Substrates for Dye-Sensitized Solar Cells," J. Am. Chem. Soc., pp. 3985-3990, 2009.

B. Liu, J. Boercker and E.S. Aydil, "Oriented Single Crystalline Titanium Dioxide Nanowires," Department of Chemical Engineering and Materials Science, pp. 1-7© 2008 IOP Publishing Ltd.

Beck, Ranier D., et al, "Resilience of All-Carbon Molecules C.sub.60 and C.sub.84 : A Surface Scattering Time-of-Flight Investigations"; J. Chem. Phys. 1991, 95, 8402-8409.

Behura, Sanjay K., et al., "Graphene-semiconductor heterojunction sheds light on emerging photovoltaics," Nature Photonics, vol. 13, 312 318, May 2019.

C. Feng-Ping, Z. Yu-Ming, Z. Yi-Men, T. Xiao-Yan, W. Yue-Hu, and C. Wen-Hao, "Temperature-Dependent Characteristics Of 4H-Sic Junction Barrier Schottky Diodes," Chin. Phys. 13, 21., pp. 037304-1 to 037304-5 (2012).

C. Pfuetler, M. Ramstelner, 0. Brandt, F. Grosse, A. Rathsfeld, G. Schmidt, L. Geelhaar, and H. Riechert, "Raman Spectroscopy As A Probe For The Coupling Of Light Into Ensembles Of Sub-WavelengthÃ?Â¬ Sized Nanowires," Appl. Phys. Letters, 101 083104 (2012).

(56) References Cited

OTHER PUBLICATIONS

Curl, Robert F. et al; "Fullerenes"; Sci Amer. Oct. 1991, 54-63.
D. M. Gruen, M. H. Mendelsohn, and M. Kirk, "Growth And Morphology Of Graphene On Silicon Carbide Nanoparticles," Materials Research Society Proceedings vol. 1411 (2012); doi: 10.1557/002012.1090; pp. 1-10.
D. Spry, P. Neudeck, R. Okojie, L-Y Chen, G. Beheim, R. Meredith, W. Mueller, and T. Ferrier, "Electrical Operation of 6H-SIC MESFET at 500C for 5000 Hours in Air Ambient," 2004 IMAPS Int. Conference and Exhibition on High Temperature Electronics (inc 2004) May 19-12, 2004, Santa Fe, NM, Int. Microelectronics and Packaging Society (IMAPS) Washington, DC, 2004.
E. Garnett, and P. Yang,"Light Trapping in Silicon Nanowire Cells," Nano Letters 10, pp. 1082-1087 (2010).
Edelson, Edward; "Buckyball The Magic Molecule"; Popular Science, Aug. 1991, 52-57; 87.
Frenklach, Michael et al; "Growth Mechanism of Vapor-Deposited Diamond", J. Mater. Res. 3(1) Jan./Feb. 1988, 133-139.
G. A. Landis, D. Merritt, R. P. Raffaelle, D. Scheiman, "High. Temperature Solar Cell Development," NASA/CP.-2005-213431; pp. 241-247 (2002).
G. A. Landis, P. Jenkins, D. Scheiman, R. Rafaelle,"Extended Temperature Solar Cell Technology Development," AIAA 2nd int. Energy Conversion Engineering Conf., Providence, RI , pp. 1-7 (2004).
Giovannetti, G., et al., "Doping Graphene with Metal Contacts," Physical Review Letters, vol. 101, 026803, 2008.
Gruen et al.; "Buckyball Microwave Plasmas: Fragmentation and Diamond-Film Growth" J. Appl. Phys. 75 (3), Feb. 1, 1994.
Gruen et al.; "Fullerenes as Precursors for Diamond Growth Without Hydrogen or Oxygen Additions" Appl. Phys. Lett. 64 (12) Mar. 21, 1994.
Gruen et al.; "Turning Soot Into Diamonds with Microwaves" Submitted for Presentation at the 29th Microwave Power Symposium, Jul. 25-27, 1994.
Gruen; "Diamonds From Dust" Submitted to Materials Technology May 1994.
H. Y Kim, J. Park, and H. Yang, "Direct Synthesis Of Aligned Silicon Carbide Nanowires From The Silicon Substrates," Chem. Comm., 256 (2003).
H.Y. Kim, S.Y. Bae, S.S. Kim and J. Park, "Fabrication of SIC-C Coaxial Nanocables: Thickness Control of C Outer Layers," Chem. Com. 2634-2635 (2003).
Huang, Mei, et al., "Novel hybrid electrode using transparent conductive oxide and silver nanoparticle mesh for silicon solar cell applications," Energy Procedia, vol. 55, 670-678, 2014.
Hummers, Jr., William S., and Offeman, Richard E., "Preparation of Graphitic Oxide," Journal of the American Chemical Society, vol. 80, Issue 6, 1339, 1958.
International Preliminary Report on Patentability dated Nov. 4, 2008 from PCT/US2007/067297.
International Search Report and Written Opinion dated Oct. 16, 2008 Cited from PCT/US08/67297.
J.A. Edmond, H. Kong and C.H. Carter, Jr., "Blue LEDs, UV Photodiodes and High-Temperature Rectifiers in 6H-SiC" Physica B 185 (1993) 453-459 North-Holland.
J.C.C. Fan, "Theoretical Temperature Dependence of Solar Cell Parameters," Solar Cells, 17, 309 (1986).
J.E. Boercker, E.Enache-Pommer and E.S. Aydil, "Growth Mechanism of Titanium Dioxide Nanowires for Dye-Sensitized Solar Cells," Department of Chemical Engineering and Materials Science, University of Minnesota, pp. 1-10© IOP Publishing Ltd., Nanotechnology 19 (2008).
Janotti, Anderson, and Van De Walle, Chris G., "Fundamentals of zinc oxide as a semiconductor," Reports on Progress in Physics, vol. 72, 126501, 2009.
K. Zhu, N.R. Neale, A. Miedaner and A.J. Frank; "Enhanced Charge-Collection Efficiencies and Light Scattering in Dye-Sensitized Solar Cells Using Oriented Ti02 Nanotubes Arrays," published on Web Dec. 2, 2006; American Chemical Society.pp. 69-74; Nano Letters vol. 7 (2007).
Khomyakov, P. A., et al., "First-principles study of the interaction and charge transfer between graphene and metals," Physical Review B, vol. 79, Issue 19, 195425, May 20, 2009.
Kratschmer, W. et al.; "Solid $C_{60}$ : A New Form of Carbon", Nature, vol. 347, Sep. 27, 1990, pp. 354-358.
Kroto, H. W. et al; "$C_{60}$ : Buck Minster Fullerene"; Chem. Rev. 1991, 91, 1213-1235.
Kuzmenko, Alexey B, et al., "Universal Optical Conductance of Graphite," Physical Review Letters, vol. 100, 117401, Mar. 2008.
Larson, Kelsey, et al., "Surface-Dependence of Interfacial Binding Strength between Zinc Oxide and Graphene," RSC Advances, vol. 5, Issue 81, 65719-64724, Manuscript Accepted Jul. 24, 2015.
Lykke, K. R. et al., "Spectrometric Characterization of Purified $C_{60}$ and $C_{70}$ "; Mats. Res. Soc. Symposium Proc. vol. 206, 679 (1991).
Mak, Kin Fai, et al., "Measurement of the Optical Conductivity of Graphene," Physical Review Letters, vol. 101, Issue 19, 196405, Nov. 2008.
Mak, Kin Fai, et al., "Tuning Many-Body Interactions in Graphene: The Effects of Doping on Excitons and Carrier Lifetimes," Physical Review Letters 112, 207401 (2014).
McCune, Mallarie DeShea, "Fundamental Study of the Fabrication of Zinc Oxide Nanowires and its Dye-Sensitized Solar Cell Applications," A Dissertation Presented to The Academic Faculty, Georgia Institute of Technology, Aug. 2012, 177 pages.
Meijer, Gerard et al; "Laser Deposition of Carbon Clusters on Surfaces: A New Approach to the Study of Fullerenes"; J. Chem. Phys. 93(11), Dec. 1990.
Meilunas et al.; "Nucleation of Diamond Films on Surfaces Using Carbon Clusters" Applied Physics Letters, vol. 59, No. 26, Dec. 23, 1991.
Monshi, M. M., et al., "Band Gap Opening and Optical Absorption Enhancement in Graphene using ZnO Nanoclusters," Physics Letters A, vol. 382, Issue 17, 1171-1175, May 2018.
Muzzillo, Christopher P., "Metal Nano-Grids for Transparent Conduction in Solar Cells," Solar Energy Materials and Solar Cells, vol. 169, 68-77, Sep. 2017.
Nair, R. R., et al., "Fine Structure Constant Defines Visual Transparency of Graphene," Science, vol. 320, Issue 5881, pp. 1308, Jun. 6, 2008.
Ni, Zhen Hua, et al., "Uniaxial Strain on Graphene: Raman Spectroscopy Study and Band-Gap Opening," ACS Nano, vol. 2, Issue 11, 2301-2305, 2008.
Parker, D. H. et al, "High Yield Synthesis, Separation and Mass Spectrometric Characterization of Fullerenes $C_{60}$ to $C_{266}$", J. Am. Chem. Soc. 113, 7499-7503 (1991).
Patent Cooperation Treaty, International Search Report and Written Opinion of the International Searching Authority for International Application No. PCT/US2020/035672 dated Aug. 19, 2020, 17 pages.
PCT Patent Application No. PCT/US2013/053919; International Search Report and Written Opinion dated Nov. 28, 2013.
Peng, Qiang, and Qin, Yuancheng, "ZnO Nanowires and Their Application for Solar Cells," Nanowires: Implementations and Applications edited by Abbass A. Hashim, Chapter 8, Jul. 2011, pp. 157-178.
Philip, M. R., et al., "Polyol Synthesis of Zinc Oxide-Graphene Composites: Enhanced Dye-Sensitized Solar Cell Efficiency," Current Nanomaterials, vol. 3, Issue 1, 52-60, 2018.
R. Voggu, B. Das, C. S. Rout, C. N. R. Rao, "Effects Of Interaction Of Electron-Donor And—Acceptor Molecules On The Electronic Structure Of Graphene," arxiv.org/pdf/0808.3165, pp. 1-10 (2009).
R.R. Nair, P. Blake, A.N. Grigorenko, K.S. Novoselov, T. J. Booth, T. Stauber, N. M.R. Peres and A.K. Geim; "Universal Dynamic Conductivity and Quantized Visible Opacity of Suspended Graphene;" Manchester Centre for Nanoscience & Nanotechnology, University of Manchester, M13 9POL, Manchester, UK, Graphene Industries Ltd., 32 Holden Avenue, M16 8TA, Manchester, UK and Department of Physics, University of Minho, P-4710-057, Braga, Portugal; pp. 1-5 (2008).

(56) References Cited

OTHER PUBLICATIONS

Rosas-Laverde, Nelly Maria, et al., "Performance of graphene oxide-modified electrodeposited ZnO/Cu2O heterojunction solar cells," Boletin de la Sociedad Espanola de Ceramica y Vidrio, No. 58, 2019, pp. 263-273.
S. Bailey, G. Landis, A. Hepp, R. Raffaelle, "Future Photovoltaic Power Generation for Space-Based Power Utilities," IAF-02-R.4.06 Selnt. Astronautical Congress/The World Space Congress (2002).
S. Pisana, M. Laueri, C. Casiraghi, K. S. Novoselov, A. K. Geim, A. C. Ferrari, and F. Mauri, "Breakdown Of The Adiabatic Born-Oppenheimer Approximation In Graphene," Nature Materials, 6, pp. 198-201 (2007).
S. Shivaraman, L. H. Herman, F. Rana, J. Park, and M. G. Spencer, "Schottky Barrier Inhomogeneities At The Interface Of Few Layer Epitaxial Graphene and Silicon Carbide," Appl. Phys. Lett., 100 183112 (2012).
S. Tongay, M. Lemaitre, X. Miao, B.R. Appleton and A.F. Hebard; Rectification at Graphene-Semiconductor Interfaces: Zero-Gap Semiconductor-Based Diodes,: American Physical Society; pp. 1-10; Received May 24, 2011; Published Jan. 17, 2012.
S. Tongay, T. Schumann and A.F. Hebard; Graphite Based Schottky Diodes Formed on Si, GaAs, and 4H-SiC Substrates; Applied Physics Letters 95, 222103 (2009).
S. Vizzini, H. Enriquez, S. Chiang, H. Oughaddou and P. Soukassian, "Nano-Structures Developing at the Graphene/Silicon Carbide Interface," Surface Science, 605 pp. L6-L11; (2011).
S.K. Sarkar, J.Y. Kim, D.N. Goldstein, N.R. Neale, K. Zhu, C.M. Elliott, A.J. Frank and S.M. George, "IN2S3 Atomic Layer Deposition and Its Application as a Sensitizer on TiO2 Nanotube Arrays for Solar Energy Conversion," Published on Web Apr. 13, 2010; American Chemical Society, pp. 8032-8039; J. Phys. Chem. C.
Schlesinger, Raphael, et al., "Controlling the work function of ZnO and the energy-level alignment at the interface to organic semiconductors with a molecular electron acceptor," Physical Review B, 87, 155311, 2013.
Srikant, V., and Clarke, David R., "On the optical band gap of zinc oxide," Journal of Applied Physics, vol. 83, Issue 10, 5447 5451, May 1998.

Stauber, Tobias, et al., "The optical conductivity of graphene in the visible region of the spectrum," Physical Review B. Condensed Matter, vol. 78, 085432, Mar. 2008.
T. J. Anderson, K. D. Hobart, L. 0. Nyakiti, V. D. Wheeler, R. L. Myers-Ward, J. D. Caldwell, F. J. Bezares, G. G. Jernigan, M. J. Tadjer, E. A. Imhoff, A. D. Koehler, D. K. Gaskill, C. R. Eddy, snf F. J. Kub, "Investigation of the Epitaxial Graphene/p-SIC ,junction," IEEE Electron Device Letters, 33, pp. 1610-1612 (2012).
T. Zimmermann, M. Kubovic, A. Denisenko, K. Janischowsky, O.A. Williams, D.M. Gruen and E. Kohn; "Ultra-Nano-Crystalline/ Single Crystal Diamond Heterostructure Diode;" Elsevier B.V.; Science Direct; Diamond and Related Materials ; pp. 416-420; ©2005.
Tavakoli, Mohammad Mandi, et al., "Hybrid zinc oxide/graphene electrodes for depleted heterojunction colloidal quantum-dot solar cells†," Journal of Physical Chemistry Chemical Physics, vol. 17, Issue 37, 24412 24419, 2015.
Van, Jon; "Exotic Form Opens New Carbon Uses," Chicago Tribune, Sunday, Nov. 3, 1991.
Wahab, M. S., et al., "Effect of reduced graphene oxide addition on the performance of zinc oxide nanorod based dye-sensitized solar cell," 4th Annual Applied Science and Engineering Conference, IOP Publishing, Journal of Physics: Conference Series, 1402 066017, 2019, 8 pages.
Wasielewski, M. R., et al "Triplet States of Fullerenes $C_{60}$ and $C_{70}$"; Electron Paramagnetic Resonance Spectra, Photophysics and Electronic Structures, J. Am. Chem. Soc. 113, 2774-2776 (1991).
Wurz, P. and Lykke, R.; "Delayed Electron Emission from Photoexcited $C_{60}$"; J. Chem Phys. 95, 7008-7010 (1991).
Y. Zhuo; C. Wu, S. Han, B. Chi, J. Pu, T. Jin and L. Jian, "Oriented Nanostructured Titanates Array From Low Concentration Alkaline Solution via Hydrothermal Process," J. Nanosci. Nanotechnol. 2011, vol. 11, No. 3, pp. 2298-2303.
Z. Liu, S. Wang, F. Yu, Y. Zhang and H Zhao, "Ti Schottky Barrier Diodes on n-type 6H-Sic," 0-7803-6520-8/01/$10.00, pp. 1183-1186, ©2001 IEEE.
Zhong, Yongchun, et al., "Exceptionally Long Exciton Photoluminescence Lifetime in ZnO Tetrapods," Journal of Physical Chemistry C, vol. 112, Issue 42, 16286-16295, 2008.

HIGH EFFICIENCY GRAPHENE/WIDE BAND-GAP SEMICONDUCTOR HETEROJUNCTION SOLAR CELLS

CROSS REFERENCE TO RELATED APPLICATIONS

This application is a continuation of prior application Ser. No. 16/890,005, filed Jun. 2, 2020, now U.S. Pat. No. 10,833,285 B2, which claims benefit of U.S. Provisional Application No. 62/856,698, filed Jun. 3, 2019, U.S. Provisional Application No. 62/924,805, filed Oct. 23, 2019, and U.S. Provisional Application No. 62/937,938, filed Nov. 20, 2019, each of which is hereby incorporated herein by reference in its entirety.

FIELD

This application relates generally to the generation of electricity using solar energy.

BACKGROUND

Various modalities of solar energy conversion are used in the art. For example, prior systems employ photovoltaic junctions in favor of converting sunlight directly into electricity. It is also known to convert sunlight into heat and to then utilize that heat to generate electricity. Conversion efficiency, for example, varies amongst different modalities with many posited modalities performing quite poorly and none achieving high conversion efficiency. Those relative conversion efficiencies, in turn, quite directly impact the return on investment an enterprise can expect to receive for pursuing a given solar energy conversion system.

Photovoltaic production of electricity, now more than 600 gigawatts globally, is increasing exponentially and will reach one terawatt in two or three years. Solar cells are made of a semiconductor material, typically silicon in crystalline solar cells. Traditionally, a solar cell has two layers: an n-type with a high concentration of electrons, and a p-type with a relatively low concentration of electrons. One side of a solar cell is "doped" with a p type material such as boron, and the other side with an n-type material such as phosphorous, creating a single p-n junction. When sunlight hits the n-type layer, electrons are dislodged from the n-region and flow through a circuit to the p-region, creating an electrical current that can be captured and used for power. Although non-equilibrium thermodynamic theory predicts that solar cell conversion efficiencies could potentially be as high as 86%, actually achieving higher efficiencies presents difficult technical challenges, and solar cells approaching such efficiencies are not now available.

Most solar cells in commercial production today are based on this architecture of a single p-n junction of doped silicon sheets, either monocrystalline or polycrystalline silicon. The solar frequency spectrum approximates that of a black body at 5,800 K. Much of the solar radiation reaching the Earth is composed of photons with energies greater than the 1 V band gap of silicon, which represents the minimum energy required to excite an electron up to a state where it can participate in conduction. These photons are absorbed by silicon, but their excess energy is converted to heat rather than electrical energy. On the other hand, much of the solar radiation is composed of photons in the infrared region of the solar spectrum whose energies are below the band gap of silicon. These cannot be absorbed by silicon thus further decreasing the conversion efficiency of silicon solar cells.

Due to these limitations, today's solar cells consisting primarily of silicon typically convert only about 15%-20% of the energy in sunlight to electricity. Silicon solar panels are also less effective at high temperatures. Heterojunction solar cells consisting of a crystalline silicon cell sandwiched between two layers of amorphous thin film silicon have been developed. The additional layers allow more sunlight to be absorbed, allowing efficiencies of 21% or slightly higher to be achieved.

Significant effort has been devoted to the development of solar cells other than silicon that can overcome the deficiencies discussed above. For example, multijunction solar cells are reported to have the potential to reach conversion efficiencies of about 45%. Such multi-junction solar cells are not made using silicon as a semiconductor. Instead, materials like gallium indium phosphide, indium gallium arsenide, and germanium are used to create separate layers of semiconductors that all respond to different wavelengths of incoming sunlight, making them more efficient at converting sunlight into electricity than single-junction cells. While they have the potential to be several times more efficient than traditional solar cells, such designs are complex and difficult to manufacture and, up to now, high fabrication costs have prevented their being used for large scale commercialization such as in roof-top or solar electric power plant applications.

Another prior approach resulting from prior work of the inventor hereof and disclosed in U.S. Pat. Nos. 8,586,999, 8,829,331, and 9,040,395 contemplates an array of nanowires comprising a wide band gap material core coated with thin graphene shells grown on a foil substrate and disposed with their longitudinal axes oriented substantially coaxial and parallel to anticipated light beams. These patents postulate that the solar energy conversion efficiency is enhanced in the nanostructured radial coaxial shell/core nanowire configuration over conventional planar solar cell configurations clue to the strong light absorption properties of the graphene and because electron diffusion lengths are much shorter. Techniques for growing titanium oxide or silicon carbide nanowire cores are also disclosed, as are methods for coating such nanowires by high temperature treatment of silicon carbide nanowires or by chemical vapor deposition using a methane environment. These patents report an expected cell voltage of the disclosed silicon carbide/graphene photovoltaic junction solar cell of about 1 V under standard sunlight intensities, which is only marginally higher than the voltage of conventional silicon solar cells. Because a graphene-based photovoltaic junction can be expected to maintain photovoltaic functionality at a useful level of energy conversion at high temperatures that are inhospitable to the functioning of photovoltaic deices that employ silicon or other materials such as gallium arsenide, the patents focus on co-generation applications in which such cells are deployed adjacent a second high temperature second modality of solar energy conversion.

The solar cell technology based on graphene coated nanowire cores disclosed in the previously referenced patents does not fully address the needs of the vast potential market for single modality photovoltaic solar power generation, such as in photovoltaic solar plants and rooftop solar panels. To overcome the shortcomings of the conventional silicon based solar cell technology in those applications, even greater conversion efficiencies are needed, as are cost effective manufacturing procedures using readily available materials. Therefore, the invention of affordable solar cells with conversion efficiencies significantly higher than provided by present day technology, and that can be economically manufactured on a large scale, would substantially lower solar electricity costs and facilitate a technological solution to the detrimental environmental impact resulting from overreliance on fossil fuel energy sources.

BRIEF DESCRIPTION OF THE DRAWINGS

The above needs are at least partially met through an apparatus pertaining to high efficiency solar cells having nanowire cores of a wide band gap material and graphene exteriors described in the following detailed description, particularly when studied in conjunction with the drawings, wherein.

Figure 1:
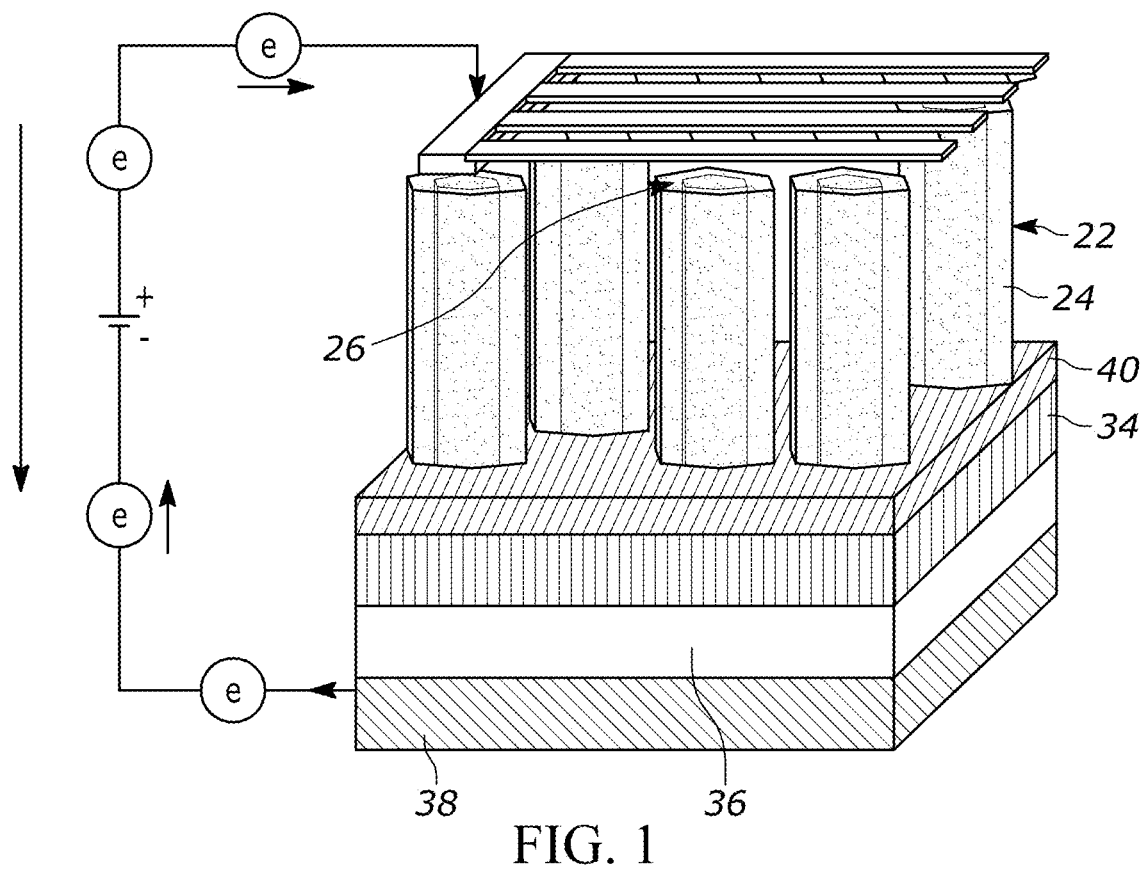
FIG. 1 is a perspective view of a portion of a photovoltaic solar cell having a plurality of nanowires.

Elements in the figures are illustrated for simplicity and clarity and have not necessarily been drawn to scale. For example, the dimensions and/or relative positioning of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention. Certain actions and/or steps may be described or depicted in a particular order of occurrence while those skilled in the art will understand that such specificity with respect to sequence is not actually required. The terms and expressions used herein have the ordinary technical meaning as is accorded to such terms and expressions by persons skilled in the technical field as set forth above except where different specific meanings have otherwise been set forth herein.

DETAILED DESCRIPTION

A photovoltaic solar cell apparatus is described herein combining the advantages of several discoveries that address the previously unsolved problem of creating high conversion efficiency solar cells at a low cost. The solar cell designs and underlying principals disclosed herein may be applied in any type of photovoltaic solar power application, such as large scale photovoltaic solar plants, rooftop panels, solar powered electronic devices, solar powered satellites, outdoor lighting, and many others.

The photovoltaic effect results in the production of electricity measured in watts, the product of current and voltage. The higher the current×voltage product, the higher the cell conversion efficiency. Energy conversion efficiency is measured by dividing the electrical power output by the incident light power. Factors influencing output include spectral distribution, spatial distribution of power, temperature, and resistive load. IEC standard 61215 is used to compare the performance of cells at terrestrial temperature: irradiance of 1 kW/m2. Specifically, a spectral distribution close to that of solar radiation through AM (airmass) of 1.5 and a cell temperature 25° C. is taken.

The magnitude of the cell current is primarily due to the light absorption properties of the cell material and the illumination intensity. On the other hand, the measured cell voltage is primarily due to the difference in what are called the "quasi Fermi levels" of the majority charge carriers. In this regard, the work function of a material is the minimum thermodynamic energy needed to remove an electron from a solid to a point in the vacuum immediately outside the solid surface. Work functions can be measured experimentally and can be shown to be directly related to the Fermi levels of the majority carriers. The measured cell voltage is attributed to the effective work function of the solar cell, which is the difference in the "work functions" of the materials that constitute the photovoltaic junction of solar cell.

New insights derived by the applicant based on an intensive and prolonged study of the scientific principles of photovoltaics, led the applicant to conclude that high conversion efficiency solar cells should absorb the total solar spectrum to provide sizeable short circuit currents while constituting materials capable of exhibiting large differences in work function so as to be capable of furnishing large open circuit potentials. The cell materials should also allow effective charge separation at the heterojunction to set the stage for a solar cell having conversion efficiencies several times higher than offered by current technology. Although these conclusions are far from self-evident, they are not a panacea in and of themselves, for the choice of materials that would constitute such cells and the elucidation of economical methods for their fabrication present formidable challenges whose solutions are not at all apparent. The solar cell apparatuses disclosed herein are composed of materials chosen in such a way as to provide large photocurrents at high photovoltages and possessing three or more times the conversion efficiency of currently available solar cells. The structure and performance of these novel cells as well as the fabrication techniques required for their effective functioning are described here in detail.

In one aspect, the apparatus can comprise, at least in part, a foil substrate having a plurality of the coated nanowire cores disposed thereon. The nanowire cores, such as including zinc oxide, are capable of exhibiting large differences in work function relative to the work function of the graphene or reduced graphene oxide shells so as to be capable of furnishing large open circuit potentials. To facilitate charge separation at the graphene-based photovoltaic junction, a substantially continuous coating of a nonconductive material, such as an insulator, is formed on the foil substrate between the nanowire cores. The first conducting electrode is electrically connected to the foil substrate to provide an electrical pathway to facilitate a movement of electrons away from the nanowire cores, and a second conducting electrode connected to the shells at a second end of the nanowire core/shell structures provides an electrical pathway to facilitate a movement of positive charges away from the shells.

In another aspect, the photovoltaic solar cell apparatuses herein are prepared by a method that utilizes a hydrothermal synthesis process to form a plurality of nanowire cores, such as of zinc oxide, on a foil substrate. In some approaches, at least a majority of the nanowire cores are substantially aligned with one another and generally perpendicular to the foil substrate. In one form, the hydrothermal synthesis process forms a substantially continuous insulator coating, such as of nonconductive zinc oxide material, on the foil substrate between the nanowire cores. The nanowire cores so formed may be subjected to a post-growth annealing process to reduce structural defects at the surface of the nanowires cores, which may be effective to improve the diode properties of the nanowire array while also reducing its electrical resistance.

In yet other aspects, efficient and effective methods are provided for cladding a graphene-based material about a portion of a respective nanowire core to form a photovoltaic junction. In a preferred form of the solar cell apparatus disclosed herein, a single layer of graphene, or no more than a few layers, surrounds the zinc oxide nanowires. The outstanding performance of the solar cell apparatus of this embodiment requires high quality and uniformity of the ultrathin graphene cladding the zinc oxide nanowires. A novel methodology is disclosed to accomplish this, which involves forming the graphene shells by thermal conversion from at least one polyaromatic hydrocarbon precursor. In another approach, the cladding technique comprises surrounding the nanowire cores with a solution containing graphene oxide followed by thermally reducing the graphene oxide to form shells of reduced graphene oxide conformally disposed about a portion of a respective nanowire cores.

In one aspect, the graphene side facing away from zinc oxide is in contact with a material that is effective to further lower graphene's work function. In this manner, the difference in work functions of the materials constituting the solar cells is increased so as to increase the built-in potential that determines the open cell voltage. Techniques for implementing this enhancement are also disclosed herein. For example, the electrode in contact with the graphene-based shells can be formed of a metal, such as silver, that reduces the graphene work function when in contact with graphene. In another form, such a metal is provided as a colloidal suspension within a partially transparent conductive material such as indium tin oxide, to form an electrode that serves the dual functions of transferring electrical current and enhancing the cell potential by reducing the graphene work function. So configured, the solar cell apparatuses according to the invention can achieve open circuit cell voltages significantly greater than are attainable using conventional silicon based solar cell designs.

These and other cladding methodologies are described in detail below as are the unique and uniquely important optoelectronic properties of the cells. Fabrication techniques, contact doping of graphene, lowering of cell series resistance, increasing work function differences and other matters pertaining to maximizing the performance parameters of the new generation of solar cells disclosed herein are detailed below. Further, while reference may be made to zinc oxide in many areas herein, it should be appreciated that other wide band-gap materials may be used in the alternative and/or in combination with zinc oxide in certain forms.

Figure 1A:
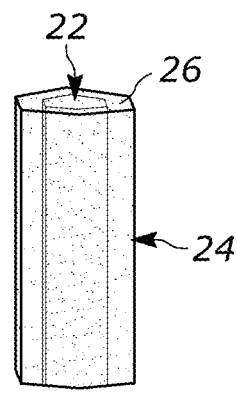
FIG. 1A is a perspective view of one nanowire coated with a shell, as found in FIG. 1.

Turning to more of the details and as generally shown in FIGS. 1-4, a schematic of a nanowire core-shell radial heterojunction solar cell is shown. Referring more specifically to FIG. 1, one illustrative example of a solar cell device 20 is provided. The device 20 includes a plurality of nanowire cores 22 having a coating 24 thereon. In one form, the coating 24 extends over the tops of the nanowire cores 22, such as illustrated at reference 26. FIG. 1A shows an enlarged view of a portion of one nanowire core 22 and coating 24.

The device 20 also includes a first electrode 30 and a second electrode 32. In one form, the first electrode 30 includes a substrate 34, which may be provided for growing the nanowire cores 22. The first electrode may include any number of additional materials and layers so as to improve overall electron transport and/or decrease resistance. For example, the first electrode 30 may include a contact layer 36 for providing suitable contact between the substrate 34 and other components in the first electrode 30 or elsewhere in the solar cell 20. The first electrode may also include a collector 38, such as used to collect and transfer electrons at the first electrode 30.

The second electrode 32 may similarly include one or more different materials and/or layers. The second electrode 32 is generally provided so as to allow light and/or photons to pass through at least a portion of the electrode 32. As shown in FIG. 1, the second electrode 32 is in the form of strips or other interconnected designs so as to allow light and/or photons to pass in-between. In other forms, the second electrode can include at least a portion that is transparent, translucent, and the like.

In one form, the device 20 includes an insulating layer 40 at the ends of the nanowire cores adjacent the first electrode 30. The insulating layer 40 generally prevents the coating 24 from contacting the substrate 34 and/or portions of the first electrode 30. If the coating 24 were to contact the first electrode, it could cause a short circuit in the solar cell.

Figure 2:
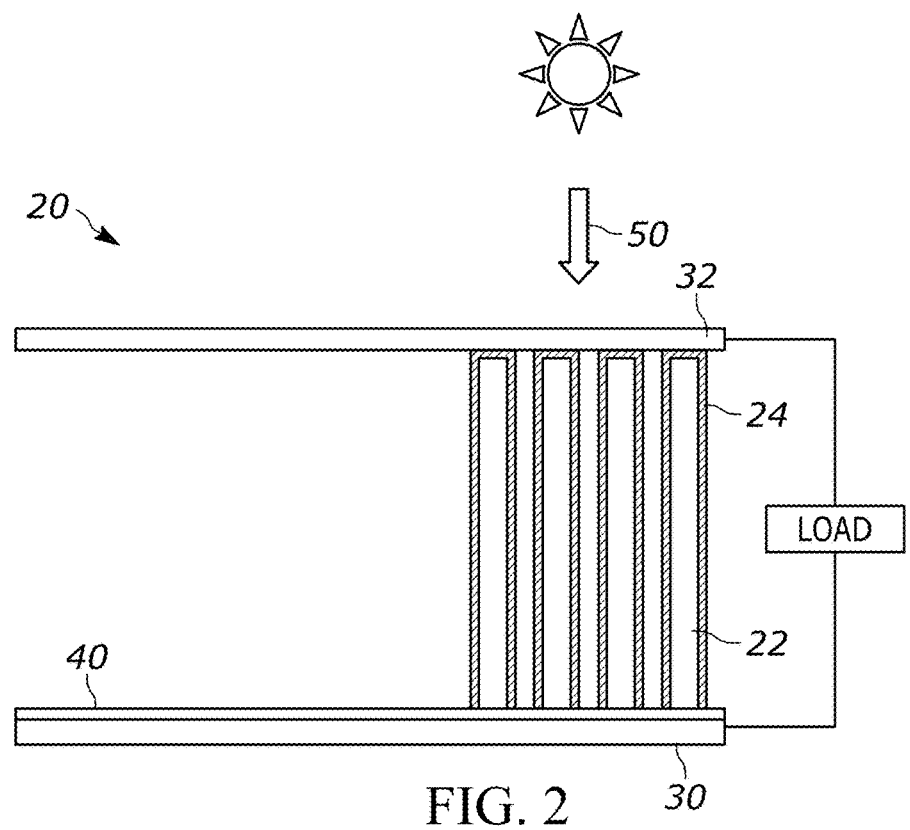
FIG. 2 is a cross-sectional view of one form of a photovoltaic solar cell.

FIG. 2 illustrates a side view of the solar cell device 20. As shown in this figure, light, as represented by arrow 50, passes at least partially through the second electrode 32 to interact with the coating 24.

Figure 3:
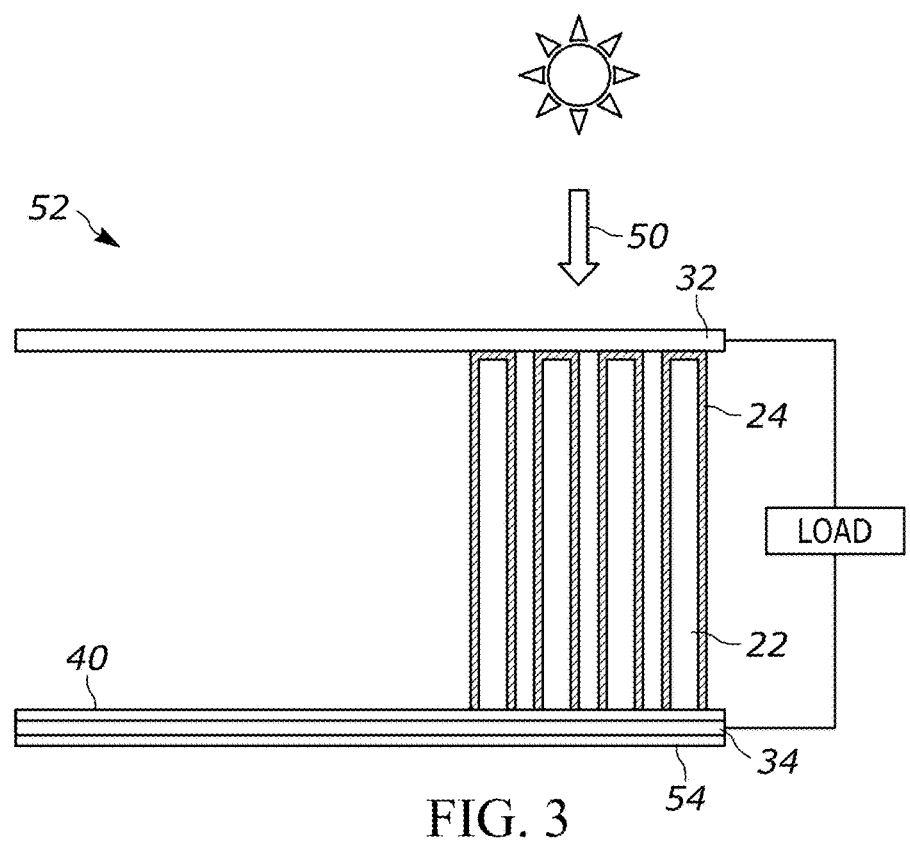
FIG. 3 is a cross-sectional view of another form of a photovoltaic solar cell having a masking layer.

FIG. 3 illustrates a similar solar cell device 52 as shown in FIG. 2. In device 52, the substrate 34 and/or first electrode 30 include a masking layer 54. Masking layer 54 may be used temporarily, such as during manufacture, or permanently, to prevent nanowire cores 22 from growing on all sides of the substrate. The specifics of masking layer 54 and use thereof will be discussed in further detail below.

Figure 4:
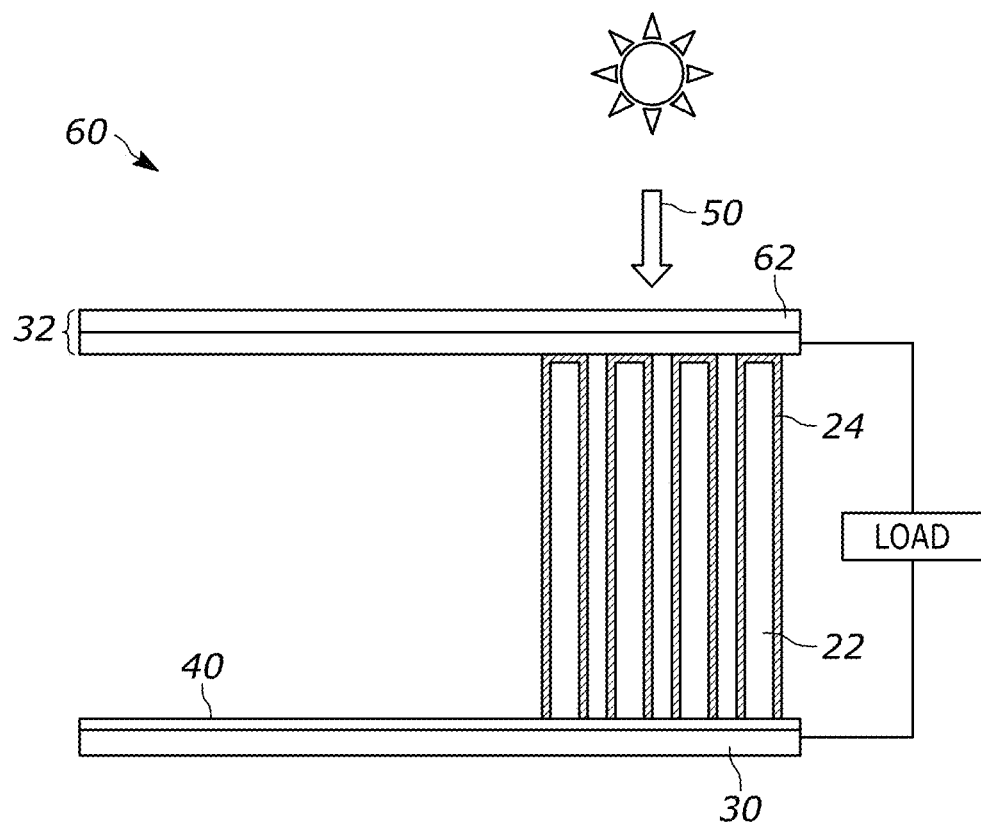
FIG. 4 is a cross-sectional view of another form of a photovoltaic solar cell having a multi-component electrode.

FIG. 4 illustrates another form of solar cell device 60. This device 60 includes an electrode component 62 that can be used as part of and/or in conjunction with the second electrode 32. The electrode component 62 can include a material that is at least partially transparent and/or translucent. The electrode component 62 can be placed on the second electrode 32, below the second electrode 32 and/or at least partially extend beyond the second electrode 32 to contact the coating 24. For example, in the form of a masked second electrode 32 as shown in FIG. 1, the electrode component 62 can pass between the spaces in the second electrode 32. Further, the electrode component 62 can extend along the length of the nanowire 22 and coating 24 to provide further contact therebetween. The electrode component 62 and use thereof will be discuss in more detail below.

There are a variety of different materials that may be used in the solar cells described herein. In general, the coating(s) comprise graphene and graphene related materials. For example, the coating may comprise generally a single layer of graphene or a few layers of graphene. In other forms, the coating material may comprise reduced graphene oxide. In this regard, depending on the application method, multiple layers of reduced graphene oxide typically result as the coating.

Graphene consists of a single layer of carbon infinitely extended in two dimensions. The chemical bonds between the carbon atoms are very similar to those in graphite. Graphene has an electronic structure that imparts unique optical and electrical properties not found in any other material. Importantly, graphene absorbs light more strongly than any other material and does so independent of wavelength throughout the entire solar spectrum. Unsupported graphene has no bandgap and electrons behave as if they were massless fermions. At the so-called Dirac point, coincident with the Fermi level, the density of quantum states is zero. Because electrons move with a velocity that is a sizeable fraction of the velocity of light, graphene follows the dictates of quantum electrodynamics rather than quantum mechanics.

The nanowire cores may also include a variety of different materials. For example, a variety of wide bandgap materials may be used. Such wide bandgap materials may include, but are not limited to, zinc oxide, boron, titanium, silicon borides, carbides, nitrides, oxides, or sulfides, combinations thereof, and the like. Wide band-gap material will be understood to refer to a material having a valence band and a conduction band that differ by at least two volts. In one form, zinc oxide may be especially suitable for at least some of the techniques and combinations of materials discussed herein.

Zinc oxide possesses outstanding optoelectronic properties. For example, density functional calculations have shown that there is a strong attractive potential, enhanced with nanowires, between zinc oxide and graphene due to a dipole induced dipole electrostatic interaction accompanied by only a small degree of electron transfer. This "contact" interaction profoundly changes certain of graphene's electronic properties such as the work function while leaving the desirable electronic structure and other electronic properties such as the Dirac point of graphene intact. It turns out that the work function of wide bandgap ZnO (3.37 eV) is also very surface sensitive and increases by up to 2.8 eV when placed in contact with selected substances. Thus, the work function of graphene decreases while that of zinc oxide increases as a result of contact between the two materials allowing graphene to function as a photoactive material. The work function changes are due to a redistribution of charge that occurs when graphene comes into contact with ZnO, with the graphene interacting with ZnO in just the requisite manner, perhaps because its ambipolarity allows it to act as an electron acceptor.

The solar cell devices disclosed herein were developed to test the conjecture that, based on these theoretical considerations, the resulting large difference in work functions might make the graphene/ZnO junction favorable for charge separation. The results disclosed herein of the experimental tests undertaken to test those conjectures confirm that graphene/ZnO heterojunctions are in fact capable of giving rise to large photocurrents as well as photovoltages and are good candidate materials for a new generation of high conversion efficiency solar cells.

As elucidated more fully in the discussion below, the applicant has developed a novel heterojunction solar cell architecture and related fabrication methods based on a p-n junction, such as in the form of zinc oxide nanowires radially clad with a single layer or up to a few layers of graphene or reduced graphene oxide. The ZnO nanowires provide for a high voltage and facilitate current transport, and the graphene material absorbs the entire spectrum of sunlight and creates the current as electrons are accelerated into the ZnO nanowire cores. The graphene material is contact charged by the redistribution of electric charge at the graphene-ZnO interface, resulting in an increase of the work function of ZnO and a decrease of the work function of graphene. The "effective work function" of the solar cell, constituting the difference in the work functions of the materials forming the p-n junction of the cell, is therefore increased and consequently the solar cells operate at significantly higher voltage levels than have previously been achieved in silicon based or other prior solar cell architectures.

As further described and demonstrated below, the present teachings enable the production of photovoltaic solar cells displaying an open cell voltage in excess of 2.4 V and as high as at least 3.5 V. With optimizations related to improve series resistance, coating uniformity and recombination kinetics, the disclosed architecture should provide photocurrent levels resulting in conversion efficiencies that far surpass that of cells used in present day photovoltaic installations.

In one approach, the nanowire cores are formed of a material that effectively distributes charge to graphene upon contact, resulting in increasing the material's work function while reducing the work function of graphene. Suitable core materials may also have an attractive potential with graphene causing them to be catalysts for the thermal decomposition and simultaneous conversion of one or more aromatic hydrocarbon precursors to form one or more layers of the graphene shell cladding the nanowires. The shells/coating 24 comprise a graphene material, which, in a preferred form, comprises graphene or reduced graphene oxide, and are preferably conformally disposed about at least a substantial portion of the cores 22. As used herein this reference to "substantial portion" will be understood to refer to an amount disposed about more than fifty percent of the nanowire surface area. Generally speaking, a viable solar cell will comprise a plurality of such nanowire cores 22 that each have a shell 24 of a graphene material disposed thereabout.

In one approach, the nanowire cores comprise zinc oxide. In other forms, zinc oxide constitutes about 50 to about 100% of the nanowire cores. As used herein, "consist substantially of" a material will be understood to refer to an amount in excess of fifty percent. In one form, the nanowire cores consist substantially of zinc oxide such that at least fifty percent of the nanowire cores is zinc oxide. The reference to the core 22 consisting essentially of a material will be understood to refer to a core 22 that is largely pure in these regards but which can include trace impurities and dopants, for example, purposefully-introduced n-type or p-type dopants designed to elicit desired electrical properties.

The nanowires are generally arranged on the foil such that they extend therefrom in a generally transverse manner. In a preferred form, the nanowires can be disposed so that at least a majority of the nanowires have their longitudinal axes substantially aligned to one another and extend generally perpendicular to the foil. As used in these regards, "substantially aligned" will be understood to mean within twenty-five degrees and "generally perpendicular" will be understood to mean extending at an angle of between 70 degrees to about 110 degrees relative to the substrate. In particular, by one approach these longitudinal axes are also oriented substantially coaxial and parallel to anticipated light beams.

The bottoms of the resulting nanowire nanostructures are attached to the foil substrate 34, thus electrically connecting all of the cores 22. The tops of the nanowires carry layers of a coating, such as the graphene material, that are in electrical contact with all of the coaxial shells 24 surrounding the nanowire cores 22. The growth process thus automatically creates a solar cell nanostructure that provides separate electrical connections to cores 22 and shells/coatings 24.

The thickness of these shells/coating of graphene material 24 can vary with the application setting. To maximize the cell voltage, however, the thickness is preferably from about one layer to a few layers. Accordingly, for many purposes the thickness of the shell 24 is very thin. Generally speaking, when employed in a photovoltaic setting, the number of layers need be no more than are required to achieve a particular amount of light absorption. It will be presumed herein that the shell 24 has an essentially uniform thickness for a given object but these teachings will accommodate variations in these regards if desired and/or as appropriate to the needs of a given application setting. For example, in some application settings it can be useful if the shell 24 has no more than about ten layers of the graphene material. In a preferred form the graphene material is graphene that is substantially 1 atom thick and in other forms the thickness ranges from 1-3 layers thick along the length of a nanowire. When the graphene material is reduced graphene oxide (r-GO), the preferred thickness is 2-10 layers thick.

By one approach, dark current and majority carrier transport can be minimized by preventing contact of the coaxial graphene material shells 24 with the foil substrate 34. This can be accomplished, for example, by chemical vapor deposition of a monolayer or multilayers of an insulator 40 in the spaces between the nanowire cores 22 prior to depositing the graphene material shells 24. Alternatively, the insulator layer 40 may be formed during hydrothermal growth of the nanowire cores themselves, as is described further below.

A solar cell apparatus in accordance with the design illustrated in FIG. 1 and utilizing an array of ZnO nanowires can take advantage of the unique optoelectronic properties of ZnO nanowires. Bulk ZnO is an insulator and although it is possessed of a quite sizeable electron mobility, it has generally been considered unsuitable as a solar cell material due to its relatively high resistivity. Nonetheless, bulk ZnO displays a very limited electron transport due to surface electrical conductivity. By structuring the ZnO in the form of nanowires, the surface electrical conductivity is vastly enhanced, presumably because the surface to volume ratio of the nanowire form is orders of magnitude larger than that of the bulk form. Compared to bulk ZnO, nanowires of this material are quite good electrical conductors.

Single layer graphene absorbs 2.3% of solar radiation and does so independent of wavelength from the infrared to the ultraviolet regions of the spectrum. The ZnO nanowires are preferably clad uniformly along their entire length with graphene to insure optimal absorption of solar radiation. In order for single layer graphene cladding to absorb all of the incident solar radiation, the graphene clad area must exceed the linear area by at least a factor of 43. By cladding nanowires with graphene, the graphene area exposed to sunlight is easily increased by two orders of magnitude compared to the "linear" area of the cell itself. In one aspect, the nanowire diameters and aspect ratios are chosen so as to fulfill this requirement. Thus, the nanowires that comprise the nanowire cores may have a longitudinal length in excess of many hundreds of nanometers. For example, the length of the nanowires can range from about 5 to about to about 25 micrometers, and the length of the individual nanowires may vary somewhat in a given solar cell. The length of the nanowires can be adjusted by changing the concentration of the starting materials. The cross-sectional diameters of the nanowires are preferably from about 40 to about 500 nanometers, although these teachings will accommodate nanowires of other diameters. The nanowire cores may be characterized by an aspect ratio (length divided by diameter) of from about 10 to about 250.

The creation of such core/shell axial heterostructures allows absorption of the total solar flux on a substantially reduced "linear" area of solar cell material. Each one of the vast numbers of such nanowires present in such a photovoltaic device comprises a unique structure that individually acts as an effective nantenna and optical rectifier. Calculations for cylindrical nanowires of radius twenty nanometers show that total light absorption occurs for nanowire lengths of about four hundred nanometers (which is, in turn, in the range of the wavelengths of visible light). Each nanowire can therefore be seen to simultaneously possess both the light (electromagnetic wave) gathering power of an antenna and the rectifying properties of a photovoltaic device.

The areal density of the nanowires may also be optimized to manipulate the optical and electrical performance of the solar cell devices according to the teachings herein. In this regard, areal density may be characterized as the number of nanowires per area of substrate, or as the proportion of the substrate area occupied by nanowires. The areal density may be determined, for example, from measurements of nanowire diameter and distance between nanowires obtained from SEM images of the nanowire array.

The areal density of the nanowires may be controlled by manipulating factors such as the chemistry of the precursor solution, temperature at which the nanowires are grown, concentration of the nucleation species used, surface roughness and crystallinity of the seed layer, and other conditions, as is understood by those skilled in the art of hydrothermal growth of nanowire arrays. In one form, the nanowires are grown such that there is a high areal density of nanowires thereon. It is generally preferable that the nanowire array be as dense as possible to maximize the power output per area of the solar cell device. However, if the areal density is too high, coating the nanowires uniformly with graphene along a substantial portion of their lengths becomes more difficult. The density and spacing of the nanowires should be as high as possible while leaving sufficient spacing to be able to coat with graphene and such that the adjacent coated nanowires do not contact one another so as to prevent short circuiting the solar cell. In one form, the areal density, in terms of the percentage of the substrate area in contact with the grown nanowires prior to coating with graphene, is approximately 10% to about 80%, though it may be more, if appropriate.

Hydrothermal synthesis processes to form ZnO nanowire arrays on many different metal foils are understood by those skilled in the art. The foil substrate can thus comprise a variety of metals, including, for example, zinc, aluminum, steel, or copper, to note but a few examples in these regards. The thickness of the foil can vary with the application setting. For many purposes, the thickness of the foil is very thin to make the solar cell apparatus flexible so that it can cover surfaces of a variety of shapes. Generally speaking, however, a thicker foil will have greater strength. For many applications, the foil is thin enough to be flexible yet thick enough to avoid being torn or ruptured in use. These teachings will accommodate variations in the selection of foil material and the foil thickness if desired for cost or other reasons and/or as appropriate to the needs of a given application setting.

By one approach, the substrate is provided as a zinc foil and a hydrothermal synthesis process is used to form an array of substantially aligned zinc oxide nanowires to serve as the nanowire cores 22. The ZnO nanowires need to be in ohmic contact with the first electrode. In one approach, this can be accomplished using hydrothermal synthesis on zinc metal foil using an aqueous solution of zinc acetate and hexamine. The presence of hexamine (hexamethylenetetramine) promotes highly anisotropic growth conditions because of selective capping of the non-polar ZnO crystallographic planes. As one illustrative example in these regards, but without intending to suggest any particular limitations in these regards, aligned ZnO nanowires can be grown using an aqueous solution of 50 mM zinc acetate and 50 mM hexamine in contact with 100 micron thick zinc foil at 90 degrees centigrade for 4 hours. Using this approach, nanowires were 100 to 200 nm in diameter and 10 to 15 microns in length, and a substantially continuous coating of a nonconductive zinc oxide formed on the foil substrate between the ZnO nanowire cores.

In another approach, ZnO nanowires could be grown at elevated temperatures using water as a source of oxygen, such as used in the process of zinc galvanization. In yet another form, a seed layer can be used to grow the nanowires.

Figure 6:
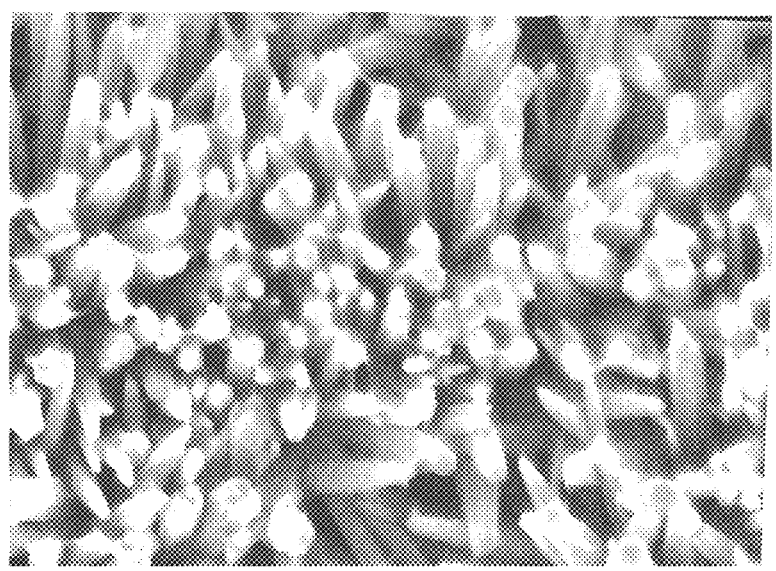
FIG. 6 is a scanning electron microscope image of ZnO nanowire cores grown on a foil substrate.
Figure 9:
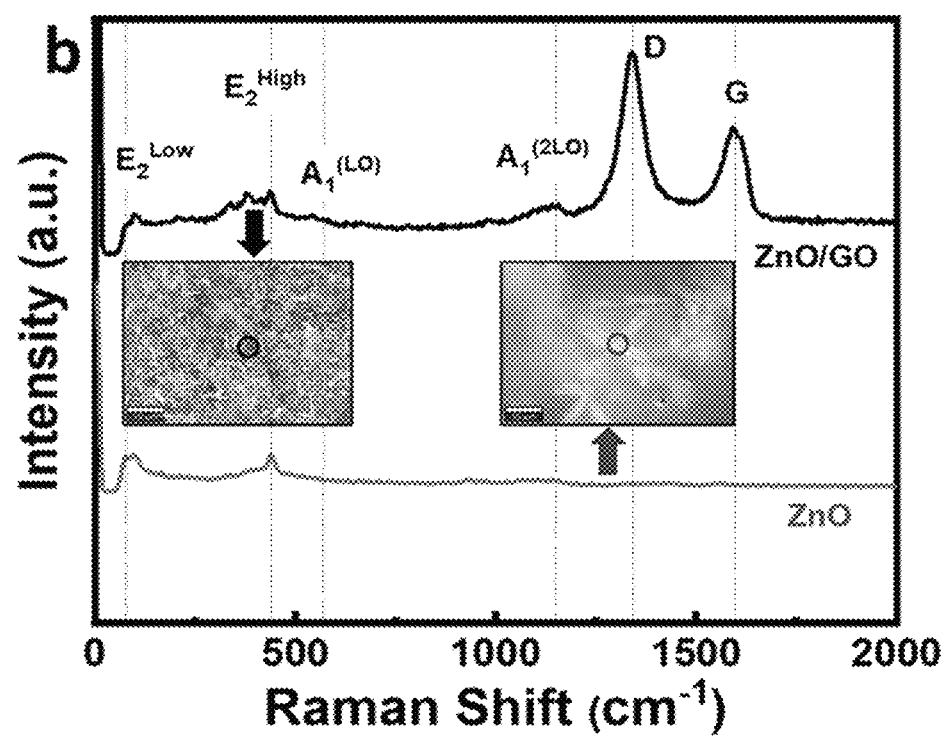
FIG. 9 is Raman spectroscopy results for ZnO nanowire cores that have been coated with reduced graphene oxide.

FIG. 6 is a field emission scanning electron microscope image taken from one end of a ZnO nanowire array formed in this manner. The nanowires have a hexagonal cross-sectional geometry and are substantially aligned along their longitudinal axis. Inelastic scattering-based Raman vibrational spectroscopy analysis of such ZnO nanowires is presented in the lower portion of FIG. 9. The E2 vibration mode peak at 438.78 cm$^{-1}$ of the lower curve is indicative of substantially pure ZnO.

Figure 18:
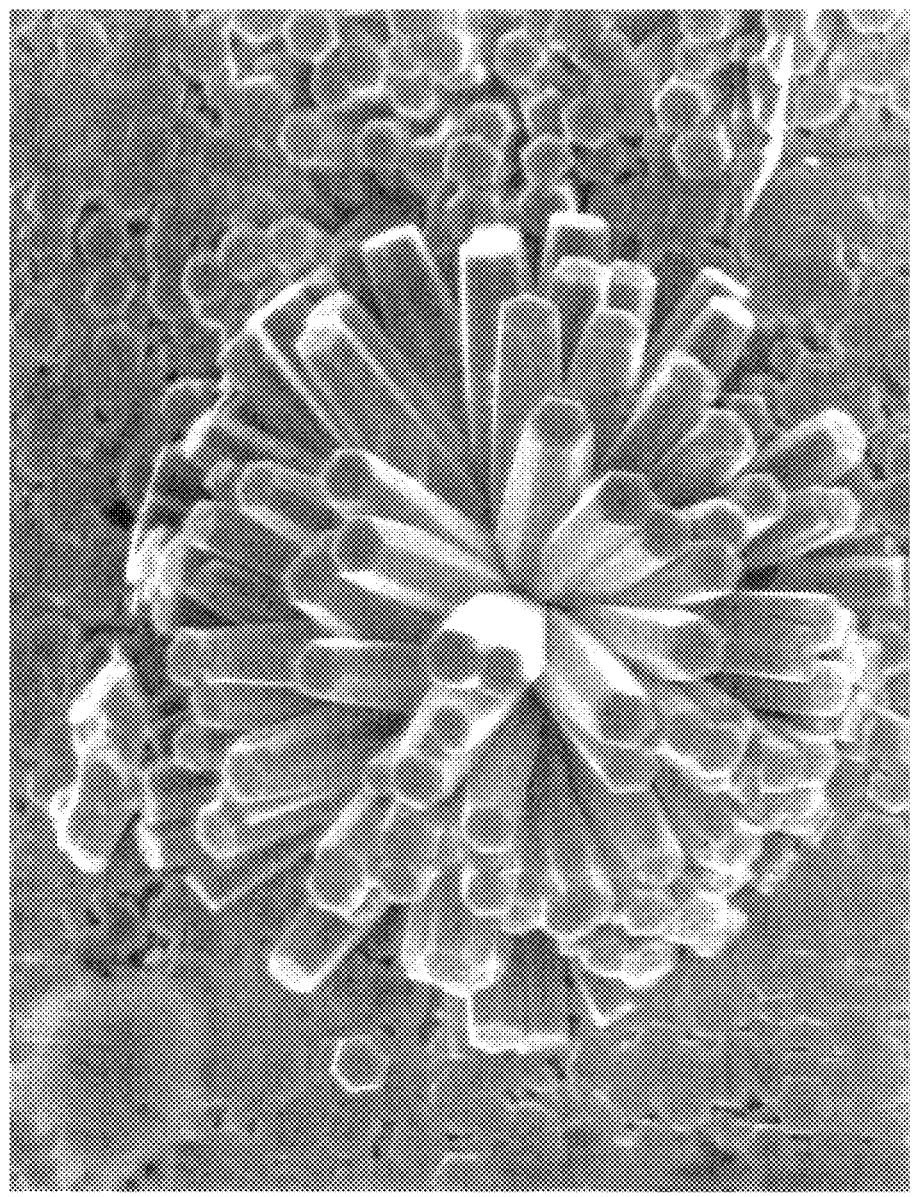
FIG. 18 is a scanning electron microscope image of ZnO nanowire cores grown on a foil substrate showing both aligned and "flower" type growth.

If the hydrothermally grown nanowires are too long, their ends may diverge outwardly in a characteristic "flower" growth pattern shown in the center region of the FESEM image of FIG. 18. Although not necessarily detrimental to the cell performance, this is preferably avoided as it may increase the difficulty of coating the nanowires uniformly with graphene.

In order for the foil to function as an electrode, one side should be protected from nanowire growth. This can be accomplished by protecting one side with a polymer film or coating, prior to forming the nanowire array, such as shown as masking layer 54 in FIG. 3. The protective polymer coating is subsequently removed, typically after cladding of the nanowires with the graphene material, such as by dissolution using one of a number of different organic solvents. In one form, this technique was deployed using polymethylmethacrylate (PMMA) to protect one side of a Zn foil from ZnO nanowire growth. Any alternative plastic coating or film capable of withstanding the temperature conditions of the nanowire growth and cladding steps can be used.

An alternative method for preventing the growth of nanowires on both sides of a foil is to double the foil so that two sides touch. Growth solution is prevented from reaching the protected sides allowing growth of nanowires to occur exclusively on the two exposed sides. After cladding the nanowires with a graphene material, the doubled foil is restored to its single foil form.

The power output of a solar cell being a function of current, it is preferable to minimize the series resistance of the cell. Series resistance in a solar cell is a combination of the resistance to current flow through the emitter and base of the solar cell, the contact resistance between the electrodes and the materials of the photovoltaic junction, and the resistance of the electrodes. The sheet resistance of the nanowire array is a principal contributor to the series resistance of the solar cells disclosed herein. Sheet resistance is used to characterize the resistance to current flow along the surface of a sheet, not perpendicular to it.

Figure 15:
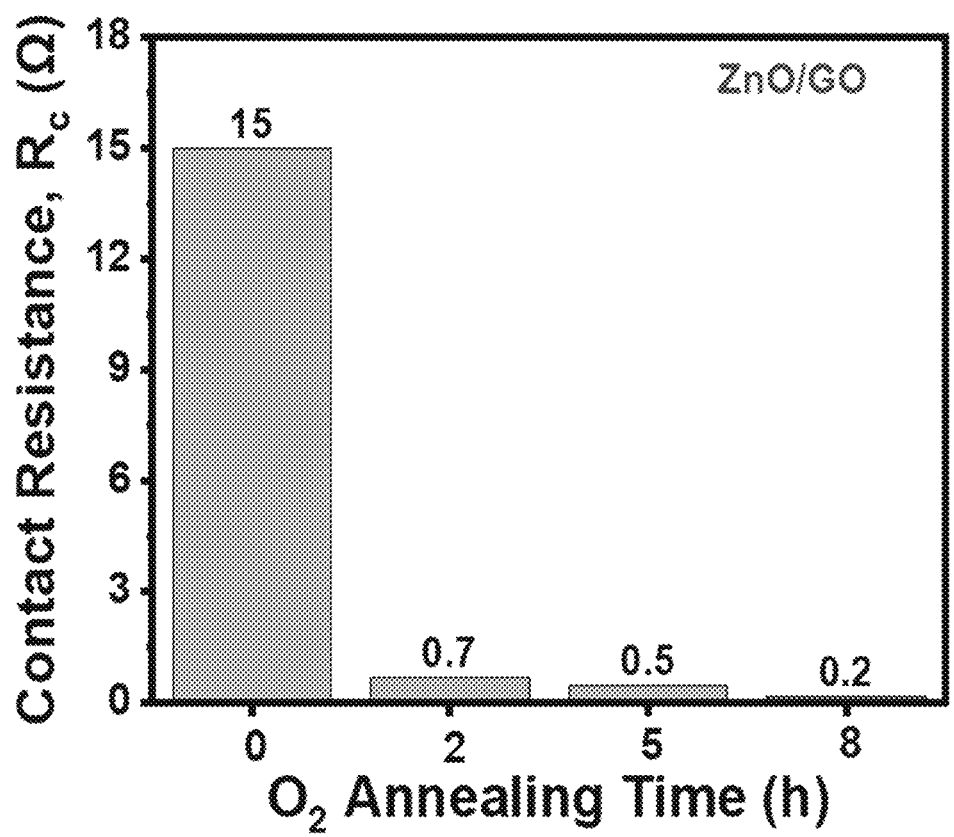
FIG. 15 is graph showing the results of annealing in an oxygen environment on the sheet resistance of ZnO nanowires.

By one approach the nanowires 22 can be subject to a post-growth annealing process to thereby reduce surface defects and increase the surface conductivity thereof in a controlled way. The annealing procedure may consist of heating the nanowire/foil composites in an oxygen atmosphere or by using other conventional techniques. FIG. 15 shows the effect of annealing of ZnO nanowire arrays in an oxygen atmosphere at 350° C. for up to eight hours prior to cladding with graphene. The nanowire array of approximately 1 cm$^2$ was formed and its sheet resistance was measured directly by using a conventional four-point probe measuring device. The sheet resistance had decreased substantially after 2 hours of annealing and by up to two orders of magnitude after 8 hours.

Further decrease in series resistance will result in a proportionate increase in photocurrent. It is believed that this may be achieved by annealing at temperatures higher than 350° C. For example, such higher temperature annealing can be performed despite zinc's relatively low melting point (about 420° C.) by contacting the zinc foil substrate with copper foil to form brass by diffusion raising the melting point and allowing the further reduction of surface defects on the zinc oxide nanowires at the higher temperature conditions.

Post-growth annealing may also improve the diode properties of the nanowires. As will be appreciated, the p-n junction formed by cladding graphene radially about a ZnO nanowire functions as a diode that conducts current primarily in one direction. The ZnO starts out as an n-type semiconductor, but when in contact with graphene material the ZnO transfers excess electrons to the graphene and the graphene becomes an n-type region that contains negatively charged electrons and ZnO becomes a p-type region that contains positive charge carriers. As is confirmed by experimental investigations presented in more detail below, the graphene coating absorbs photons of sunlight and a flow of electrons occurs from the graphene to the ZnO.

The impact of oxygen annealing has also been shown to significantly improve the cell rectification factor. In this regard, the cell rectification factor is understood to refer to the ratio of the forward to the reverse current. In one study performed for the r-GO/ZnO heterostructure before and after 02 annealing for 8 hours at 400° C., the rectification factor increased from 0.52 to 1.82 (4-fold increase), indicating a much higher forward current than the reverse saturation current. Having a good rectification factor influences the ideality of the fabricated diode for optoelectronic applications. Lower reverse saturation currents are preferred to avoid leakage current and less observed voltage under solar insolation.

In another aspect, doping of the nanowire cores 22, such as by addition of dopants to the growth solution, may be used to increase the electrical conductivity thereof in a controlled way as one technique for reducing the series resistance of the solar cell apparatus. In one aspect, one or more dopants are included along at least a portion of the longitudinal surface thereof. Dopants may include, but are not limited to at least one of aluminum, indium, chlorine, and gallium. Such an approach to doping can help to optimize the characteristics of the junction between the nanowire cores and the coating, such as the graphene-zinc oxide junction, to yield a solar cell that displays maximum efficiency with respect to converting light to electricity.

After formation and any subsequent annealing and/or doping steps, the aligned zinc oxide nanowires 22 can be exposed to a cladding procedure to deposit a graphene material along the longitudinal surfaces in the spaces between the wires as well as on the top surfaces of the nanowire cores 22 themselves. By one approach, this coating or shell 24 may consist primarily of reduced graphene oxide and/or graphene and comprises, for example, from a few layers to no more than about ten layers in thickness. For example, Hummers method (W. S. Hummers and R. E. Offeman, JACS 1958) can be used to synthesize few layer micrometer sized flakes of graphene oxide (GO) to be used as a cladding for the ZnO nanowires. Graphite is treated using well-known procedures involving nitric and sulfuric acids together with KClO3 or KMnO4 as oxidizing agents to make graphene oxide (GO).

Cladding of the ZnO nanowires may proceed by drop-casting an aqueous suspension of graphene oxide onto an array of aligned ZnO nanowires, followed by heating to a temperature of about 300° C. in a hydrogen environment for about 2 hours. Various other methods such as drop, dip and spin coating can alternatively be used to surround the nanowires with graphene oxide. The GO flakes are reduced thermally by heating in a hydrogen atmosphere. Some oxygen remains in substitutional sites yielding reduced graphene oxide, a disordered form of a few layers of graphene. The uniformity of the cladding is enhanced by adding isopropyl alcohol or acetone as wetting agents to the aqueous suspension prior to drop-casting. In order to prevent short circuits from occurring, it is desirable that the reduced graphene oxide does not come in contact with the Zn foil or substrate carrying the ZnO nanowires.

Other methods for surrounding the ZnO nanowires with a thin coating of r-GO are also possible. For example, known methods for solubilizing r-GO flakes to form a solution or to make a colloidal suspension of r-GO flakes can be used so that the nanowire coating process can be performed from a solution. In such an approach, the solution or stable colloidal suspension of r-GO flakes is applied to the nanowires and the solvent allowed to evaporate with optional heating to remove impurities. Alternatively, such an approach can be used to coat the nanowires with graphene from a solution of graphene nanoflakes.

Figure 7:
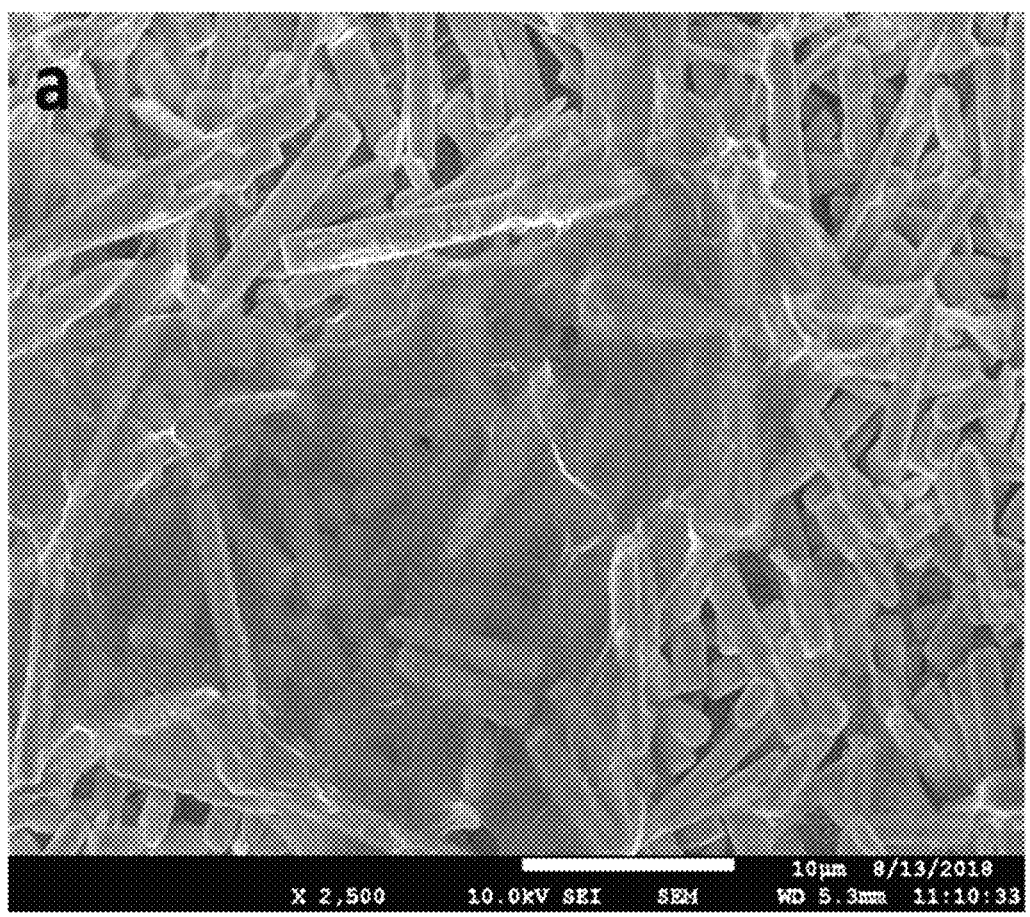
FIG. 7 is a scanning electron microscope image of ZnO nanowire cores that have been coated with reduced graphene oxide.

FIG. 7 is a field-emission scanning electron microscopy of hydrothermally grown and oxygen annealed ZnO nanowires coated with r-GO. The FESEM topography characterization showed an approximate length of about 10 microns which were vertically aligned with some horizontal wires residing on top of the parallel vertically ordered ZnO nanowires. The cladding of r-GO is clearly observed as a transparent thin layer wrapping around ZnO nanowires and covering the top surface as well as yielding good interfacial contacts with the semiconductor. The coated nanowires are more round compared to the hexagonal uncoated nanowires, indicating that the r-GO coating is several layers thick.

Raman vibrational spectroscopy analysis was also carried out to illustrate the existence of both ZnO cores and r-GO shells in the co-axial hetero-architecture. One such spectra is presented in the top spectra in FIG. 9. The ZnO samples showed the corresponding ZnO peaks $E_2^{low}$ and $E_2^{high}$ due to in-plane vibrations of Zn—O bonds. The r-GO/ZnO heterostructure exhibited the in-plane vibrations-based E peaks as well as the A peaks attributed to out-of-plane vibrations of Zn—O bonds. Moreover, the defect-induced "D" and graphitic "G" modes where observed in the r-GO/ZnO nanocomposite indicating the presence of r-GO.

Figure 11:
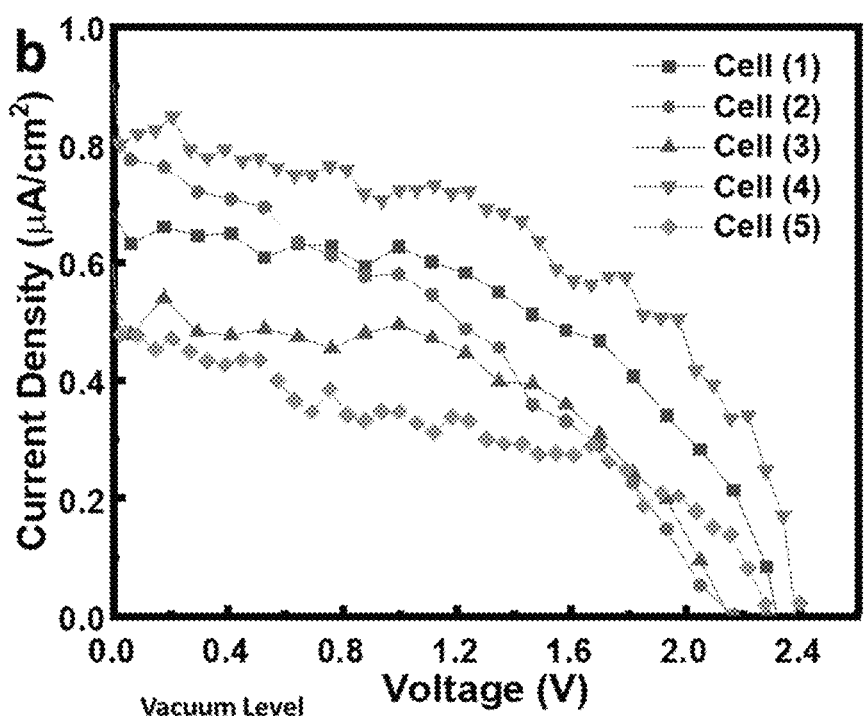
FIG. 11 is a current versus voltage graph for a photovoltaic solar cell having ZnO nanowire cores coated with reduced graphene oxide and using a silver electrode in contact with the reduced graphene oxide.

The r-GO clad ZnO nanowire heterojunction photovoltaic cells with a silver electrode patterned as generally shown in FIG. 1 in contact with the r-GO in accordance with the principles disclosed have attained open circuit voltage of up to about 2.4 V, which is significantly higher than that possessed by any previously single junction solar cell of which the applicant is aware. By comparison, the open cell voltage of silicon based solar cells typically does not exceed 0.6 V. The current density vs. voltage profile of five such cells illuminated with 1 KW/m$^2$ of AM 1.5G irradiation is presented in FIG. 11. As will be appreciated, AM 1.5G is a standardized light spectrum that approximates overall yearly average solar irradiance for mid-latitudes in the United States and is used by the solar industry for standardized testing or rating of terrestrial solar cells or modules. (The latest AM 1.5G standards pertaining to photovoltaic applications are reflected in ASTM G-173 and IEC 60904.) The current and voltage profile was generated by use of a standard Keithley Source Meter. The observed differences between the current density and voltage profiles of the individual cells are likely attributable to factors such as variance of the r-GO coating uniformity and/or of the dimensions and density of the nanowires.

The large open-circuit voltage (i.e., the voltage when overall current flow through the solar cell is zero) observed can be rationalized based on a very large work function increase reaching 2.8 eV that occurs when ZnO is in intimate contact with a strong electron acceptor. Graphene, because of its amphoteric character, can serve in this capacity with ZnO acting as the electron donor. Owing to the interfacial charge transfer between r-GO and ZnO, the ZnO donates electrons to graphene. Therefore, the work function of ZnO increases about 1 eV and for r-GO it decreases. Upon illumination, photons generate excitons (bound electron-hole pairs) in the exterior r-GO shell and exciton dissociation take place at the heterojunction due to the existing built-in electric potential. The electrons transport from the low work function graphene to the large work function ZnO.

Figure 16:
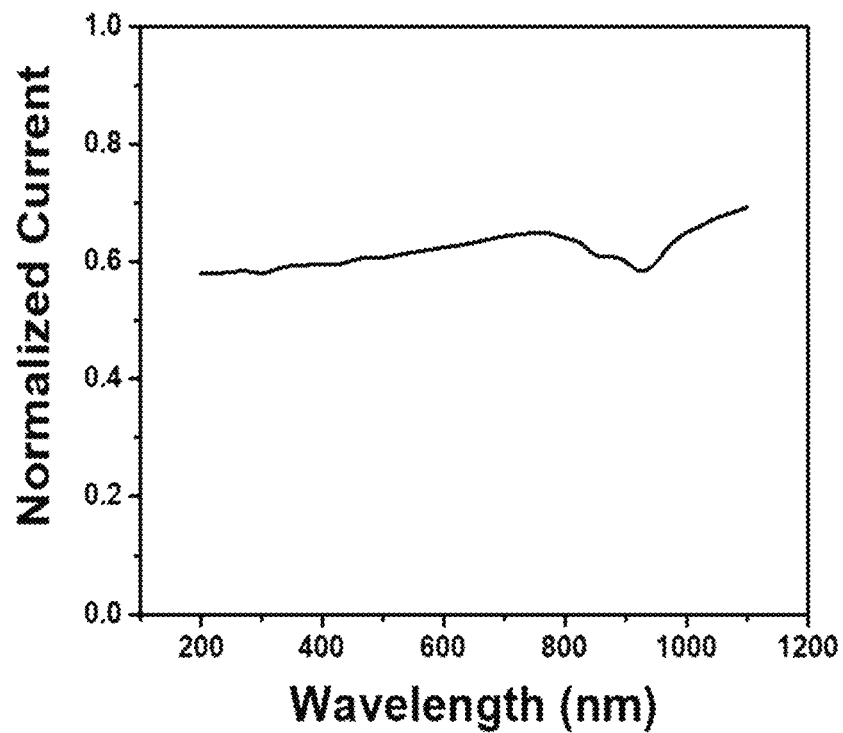
FIG. 16 is a graph of normalized current versus illumination wavelength illustrating wavelength independence of the graphene light absorption coefficient.

The investigations underlying the disclosure herein have also confirmed that graphene functions as the photoactive element by following the photocurrent as a function of wavelength. As shown in FIG. 16, the normalized photocurrent (i.e., the current corrected for sensitivity of the phototube measuring device) generated from the heterostructure is substantially constant over a broad wavelength range from 200 to 1100 nm. This indicates that exciton generation takes place in r-GO since ZnO does not absorb light in the visible region of the spectrum. The r-GO can absorb all the sunlight energies corresponding to a UV-Vis-IR wavelength ranging from 200 to 1100 nm and into the IR. The maximum absorption for r-GO occurs at 290 nm which is located in a UV region; however, most of sunlight energy is actually in the visible region and can only be absorbed by r-GO in the ZnO/r-GO heterostructure.

Since the normalized current data shows a stable photogenerated normalized current of 0.6-0.7 from 200 to 1100 nm, one may conclude that uniform r-GO clad ZnO nanowires result in solar energy absorption across the whole solar spectrum to generate observed wavelength independent photocurrents. The use of ZnO nanowires without graphene cladding would not yield a significant photo current due to the fact that ZnO is a wide-band gap semiconductor (3.37 eV) requiring sunlight in the ultraviolet part of the spectrum to photoexcite ZnO orbital electrons from the valence to the conduction band in order to generate electron-hole pairs. Since essentially all of the solar spectrum lies at energies lower than the ultraviolet, the electron excitation to form electron/hole pairs occurs essentially only in graphene. Charge separation occurs at the junction of graphene with ZnO yielding photocurrent at a cell voltage up to 2.4 V.

Figure 17:
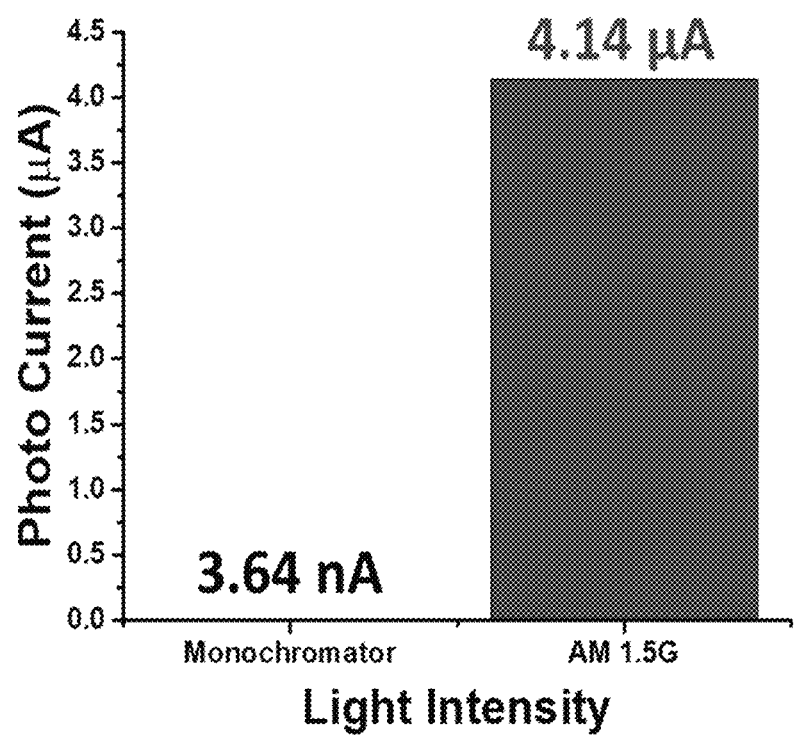
FIG. 17 is a graph of photo current versus two light intensities differing by three orders of magnitude for a photovoltaic solar cell having ZnO nanowire cores coated with graphene.

The experimental results displayed in FIG. 17 show that the magnitude of the photocurrent is linearly dependent on light intensity over a range of three orders of magnitude. With the AM 1.5G light source a photocurrent of 4.14 pA is generated compared to a photocurrent of 3.46 nA produced when using monochromatic light. The AM 1.5G light source includes all wavelengths of the solar spectrum. Its intensity was measured to be three orders of magnitude higher than the light intensity of the monochromatized source.

Yet another aspect of the invention involves enhancing the open cell potential by contacting at least a portion of the outer surface of the coating or shells, such as r-GO shells (i.e. the surface facing away from the ZnO cores), with a material that functions as an electron donor to graphene. In one preferred aspect, the electron donor material may also function as a current gathering electrode. Such an electrode may be formed, for example, by depositing a paste of silver nanoparticles through a patterned mask that had been placed on the r-GO terminated surface of the cell. In the illustrated embodiment of FIG. 1, the metal is patterned as a series of spaced, elongated fingers extending perpendicularly from a bus bar, which allows for sufficient surface contact between the metal and the r-GO shells.

Figure 5:
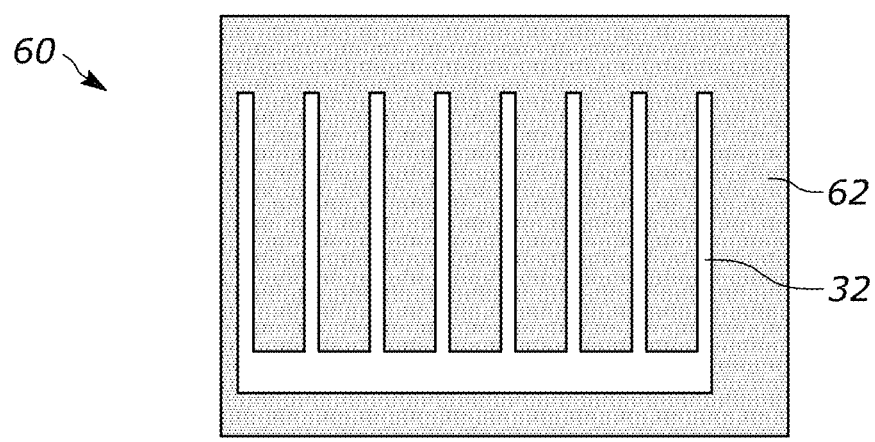
FIG. 5 is a top view of one form of a photovoltaic solar cell.

A prototype of a 1 cm² cell is displayed as FIG. 5, which shows the top of the cell with a silver layer contacting the top surface of the r-GO coated ZnO nanowire array. Sunlight illuminates the graphene by penetrating between the narrow silver fingers. The metal layer may be provided in other geometries that can similarly function to create a surface contact with the r-GO shells while allowing sufficient sunlight penetration. In this way advantage is taken of the substantial photon absorption characteristics of the nanowire array clad with r-GO that constitutes important constituents of the solar cell device.

Silver acts both as an n-type contact dopant and as an electrode. The silver electrode was effective to increase in the open circuit potential to about 2.4 V. While not wishing to be limited to any theory, this effect may be the result of a similar redistribution of charge between the metal and r-GO resulting in contact charging that decreased the work function of the r-GO shells by an amount that corresponds to the observed increase in the cell open circuit potential. As discussed below, this effect has also been demonstrated in alternative embodiments having shells of substantially single layer pure phase graphene produced from polyaromatic precursors. Indeed, by judicious contacting of the single layer graphene/ZnO nanowire/silver composite the open circuit voltage was found to have been increased to 3.5 V. Further, it is believed similar improvements can be made with other nanowire core materials as well as by using other electron donor contact charging materials that can simultaneously function as electrodes.

Thus, by one approach, both sides of the graphene-based shells are used to lower the graphene work function and thereby increase the open cell potential. In such embodiments, the graphene coating or cladding is in essence being charged by two "plates" to develop giant built-in potential. Although the significant performance benefit of this important discovery has been demonstrated using silver, other metals such as aluminum, copper, and others in reducing the work function of graphene by donating electrons to graphene. In addition, materials such as ZnO could also be used as the contact charging material in the double contact charging configuration disclosed herein. The teachings herein will enable those skilled in the art to identify other suitable alternative contact charging materials by comparison of cell voltage measurements of solar cells made with and without the candidate material in contact with the graphene material shells.

The arrangements for implementation of double contact charging are not limited to contacting the electron donor with the ends of the nanowires as illustrated in FIG. 1. For example, the electron donor may alternatively be arranged so as to contact positions along the length of the nanowire. Combinations of these approaches may also be effective. According to another aspect, described in more detail below, the chosen charging material is incorporated within another material, such as an organic or inorganic transparent electrode conductive material, that functions as the electrode for the graphene side of the photovoltaic junction.

Turning back to approaches for cladding the ZnO nanowire cores in accordance with the disclosure herein, in another approach, the nanowires are clad with an ultra-thin coating, consisting of single layer to no more than a few layers, of graphene. Polyaromatic hydrocarbons (PAH) such as coronene, pentacene, naphthalene and others thermally decompose on metals such as copper to form single layer graphene at modest temperatures. It was not known, however, whether similar results could be obtained with ZnO nanowires. Additional investigations have led to the discovery of techniques utilizing these precursors that are effective to deposit one to a few layers of essentially pure phase graphene substantially uniformly along substantial portions of the outer surface of the ZnO nanowires.

As an illustrative example of this newly developed cladding technique, coronene was dissolved in tetrahydrofuran and drop-cast onto ZnO nanowire arrays hydrothermally grown on Zn foil. These assemblies were heated in an argon atmosphere at temperatures between 200° C. and 400° C. for one to two hours. A thin layer of this solution in contact with ZnO decomposes to form graphene and the remainder evaporates.

Figure 8:
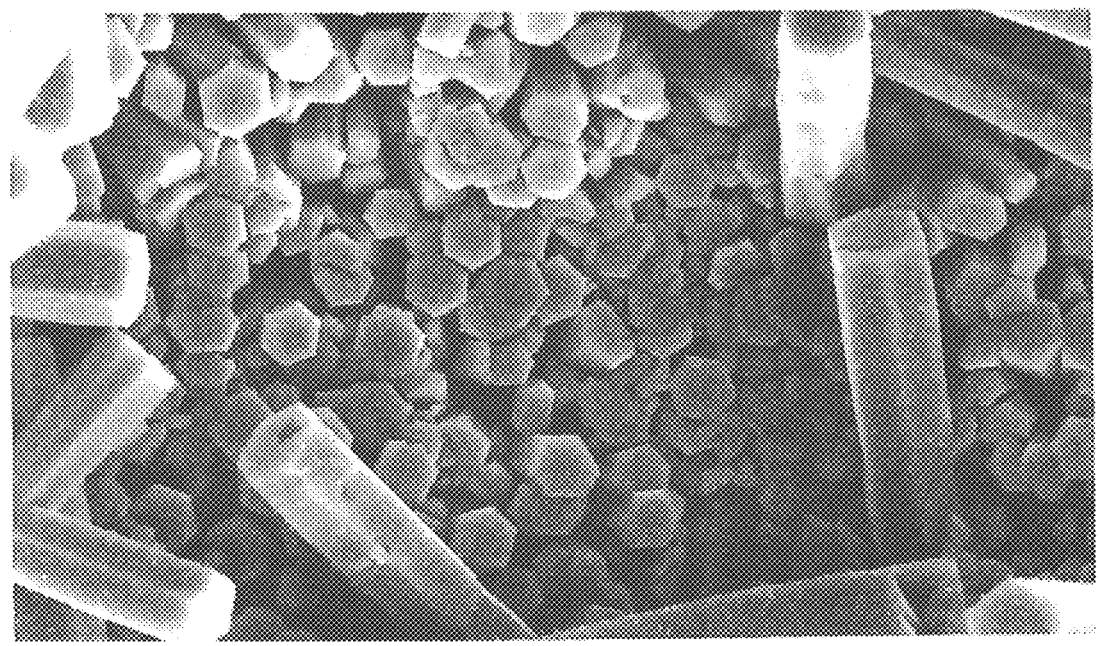
FIG. 8 is a scanning electron microscope image of ZnO nanowire cores that have been coated with graphene using a polyaromatic hydrocarbon.
Figure 10:
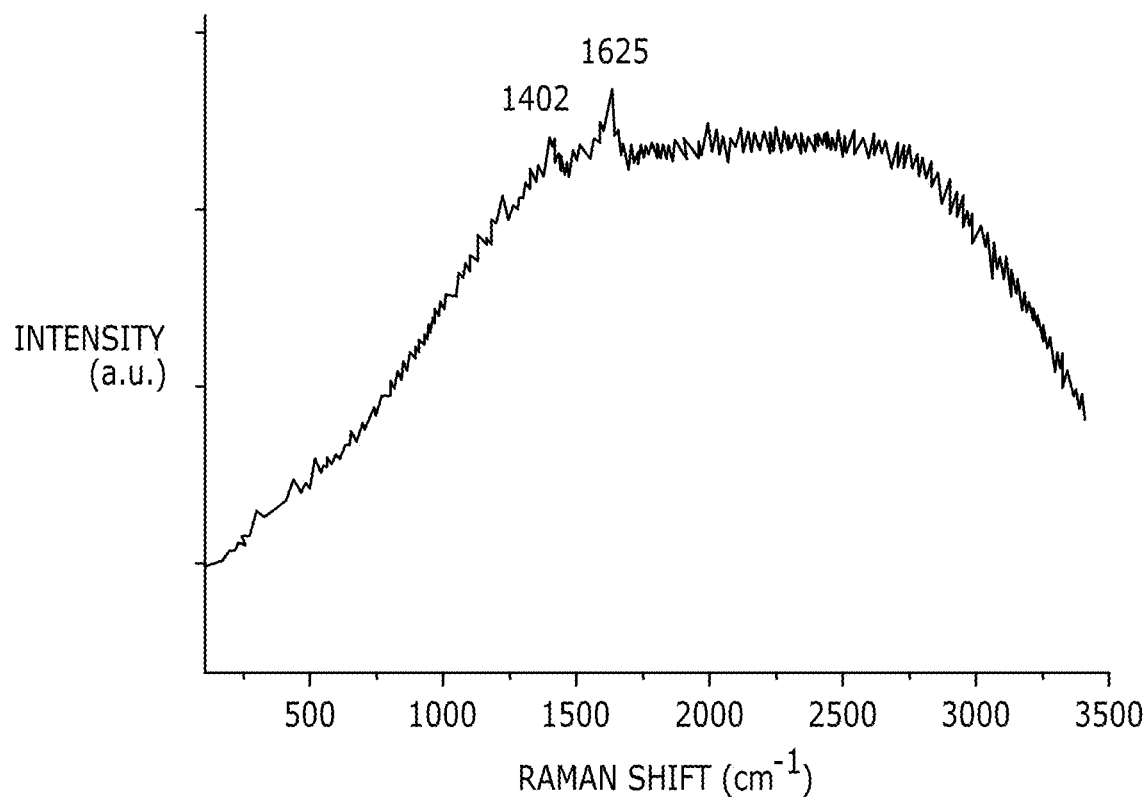
FIG. 10 is Raman spectroscopy results for ZnO nanowire cores that have been coated with graphene using a polyaromatic hydrocarbon.

With reference to FIG. 10, Raman spectroscopic examination revealed that thermal decomposition had indeed resulted in the formation of high-quality graphene as evidenced by G/D band intensity ratios of about 2.0. Electron microscopy images of the clad nanowires, such as the image displayed in FIG. 8, show that the hexagonal facets of the nanowires are preserved suggesting that growth of single layer graphene has occurred. The discovery disclosed herein of a solution to overcoming the difficult challenge of cladding with graphene billions or even trillions of densely packed nanowires has significant implications for the commercial scale production of high efficiency solar cell devices. It is believed that the very strong attractive potential of about 1 V that has been shown by theoretical density functional calculations to exist between graphene and ZnO lowers the activation energy for the transformation of PAHs to graphene and becomes, in a sense, the driving force for the reaction. The ZnO surface can be thought of as functioning as a catalytic surface for the reaction enabling the formation of an ultrathin layer of graphene on a nanowire structure, and at temperatures as low as 200° C. The reaction is self-limiting because once the graphene layer forms on the surface it remains there rather than leaving the ZnO surface to allow the next PAH molecule to be catalyzed. While the above description uses ZnO, it is believed that other wide band gap nanowire core materials may also be suitable for use in this manner.

Based on the insights derived from this work, other aromatic molecules, such as substituted benzenes, are also believed to be suitable precursors to clad ZnO nanowires with an ultrathin coating of from one to a few layers of graphene according to the teachings herein. This technique is also adaptable to nanowires formed of other materials that exhibit attractive potential with graphene, as can be identified by theoretical density functional calculations.

This disclosure of a technique for coating high density nanowire arrays with an ultrathin coating of graphene has significant implications for the production of high efficiency solar cells. The open circuit voltage of such graphene clad ZnO nanowire solar cells was observed to be about 1.9 V under 1 KW/m$^2$ of AM 1.5G illumination, even without contact charging the graphene with a metal electrode to decrease its work function. In combination with a silver electrode in contact with the graphene shells, open cell potentials as high as 3.5 V were observed. The higher cell potentials achieved in such solar cell devices compared to those clad with r-GO are believed to be due to the higher graphene quality of single or few layer graphene produced from polyaromatic hydrocarbons. Since contact charging is an electrostatic phenomenon, charges transferred from the metal layer are distributed over a single rather than over several layers of graphene. The transferred charge can therefore be expected to result in a higher graphene charge density. In this way, the built-in potential is increased resulting in the observed increase in the open circuit potential.

The ultrathin graphene coating obtained by thermal transformation of polyaromatic hydrocarbons decreases the width of the junction to about 2-3 angstrom compared to about 8-9 angstrom for ZnO nanowires clad with several layers of r-GO. This, in addition to higher graphene quality, may be another reason for the superior functioning of single layer graphene in this photovoltaic device.

In yet another aspect, graphene shells may be doped to further control the graphene work function. In particular, doping the shells with n-type dopant such as nitrogen, by heating in an ammonia atmosphere for example, or other n-type dopant, can further reduce the work function of the graphene by at least 0.5 V, which may enhance the open circuit potential even more. It should also be kept in mind that it is unlikely that the open circuit voltage to exceed the band-gap of the material constituting the nanowire core.

The creation of a graphene-based nanocomposite photovoltaic device displaying an open circuit voltage as high as 3.5 V enables a new class of potentially high efficiency solar cells. In addition to high open circuit voltage, high short circuit currents are necessary to achieve high power conversion efficiency. As discussed above, since current flows on the surface of the ZnO nanowires, the current density can be enhanced by controlling the nanowire growth conditions to increase the surface to volume ratio of the nanowires by reducing their diameter.

Another factor believed to affect the short circuit currents of devices fabricated in accordance with the disclosure herein relates to electron/hole recombination kinetics. Exciton lifetimes in have been reported to not exceed a few femtoseconds in pristine graphene. Recombination kinetics could strongly compete with electron transport across the heterojunction. To address this, an appropriate dopant may be found which act to increase exciton lifetimes and thus increase the photocurrent. The inclusion of one or more of such dopants in the graphene or r-GO shells can result in more favorable electron/hole recombination kinetics and increase the photocurrent produced by the disclosed solar cell devices.

In another aspect, the photocurrent performance of the solar cell device may be optimized by the inclusion of conductive material to establish electrical contact between the nanowires. Transparent conducting oxides such as indium tin oxide (ITO), or ZnO based conducting transparent oxides or sulfides, for example, can be effective for this purpose and may be disposed between the nanowires. Indium tin oxide was chosen because it is readily available. It was deposited as a thin film by drop coating. Alternatively, thin films of indium tin oxide can be deposited by many other techniques such as spray coating, or spin coating, physical vapor deposition, electron beam evaporation, or a range of sputter deposition techniques. Other suitable optically transparent conductors include conductive organic polymers such as polyethylenedioxythiophene polystyrene sulfonate (PEDOT:PSS) and many others, which may be deposited in organic solvents or in aqueous suspensions.

The conducting material may be located on top of the cell to form all or part of the counter electrode, and/or in the interstitial space between the graphene or r-GO clad nanowires of the array. In another study, a very substantial decrease in series resistance was achieved by drop casting a suspension of nanometric indium oxide/tin oxide in isopropanol on the top graphene terminated surface of the nanowire array. In this way electrical contact was established between graphene clad ZnO nanowires. The resulting impact on cell performance is discussed with respect to the experimental results described further below.

In another aspect, the transparent conductive electrode material may include a metal effective to reduce the graphene work function, to thereby enhance both the voltage and current density performance of the cell. For example, a colloidal suspension of nanoparticles of silver in ITO is applied to the graphene nanowire array to form the electrode and improve the charge mobility within the array. Alternatively, the silver or another metal may be applied to the graphene coated nanowire array followed by drop casting a suspension of ITO to fill the space between nanowires and form a top conductive layer of the solar cell.

Figure 12:
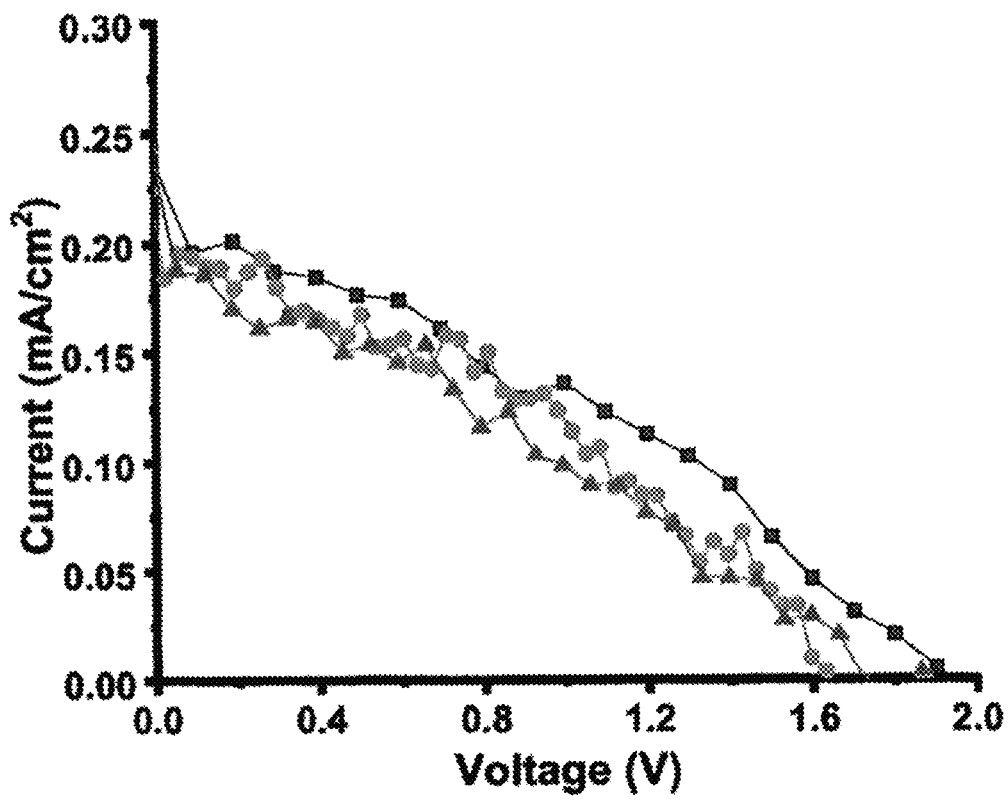
FIG. 12 is a current versus voltage graph for a photovoltaic solar cell having ZnO nanowire cores coated with graphene from a polyaromatic hydrocarbon and using an indium tin oxide electrode in contact with the graphene.

Additional experimental results demonstrating the effectiveness of the principles disclosed herein in optimizing the photovoltaic properties of the radial heterojunction solar cells disclosed herein will now be discussed. FIG. 12 shows the current density versus voltage profile for a cell having a core-shell heterojunction of graphene wrapped ZnO wires grown on zinc foil and coated by hydrothermal decomposition of coronene. In this particular cell, a copper electrode was in electrical contact with the zinc substrate. ITO was deposited between the nanowires and over the top of the cell to increase the electrical contact between the nanowires and provide the counter electrode for the graphene coating. Each line represents measurements taken by contacting at different points of the cell under 1 KW/m$^2$ of AM 1.5G illumination. The data shows that the cell displayed an open cell voltage as high as about 1.9 V and a short circuit current density in the low mA/cm$^2$ range. These results show that the surface interaction between the ZnO and the ultrathin substantially pure phase graphene coating generates large cell potentials even without contact doping the opposite side of the graphene.

Figure 14:
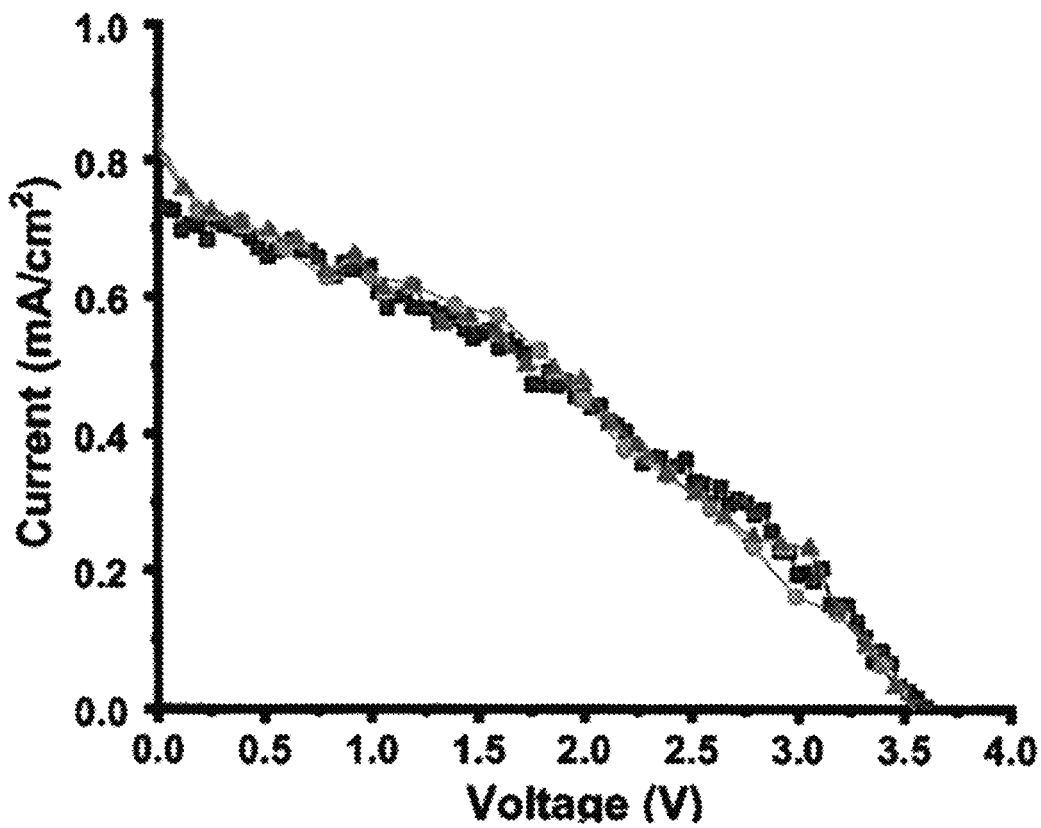
FIG. 14 is a current versus voltage graph for a photovoltaic solar cell having ZnO nanowire cores coated with graphene from a polyaromatic hydrocarbon and using an electrode including silver and indium tin oxide in contact with the graphene.

FIG. 14 displays the corresponding current density versus voltage profile for a photovoltaic cell of a construction similar to that of the cell corresponding to FIG. 12, except that a silver electrode was applied to the nanowire array and the ITO was deposited over the silver electrode. The open cell voltage increased significantly to about 3.5 V, owing at least in part to the effect of silver in decreasing the work function of the graphene shells and thereby increasing the difference between the work functions of the graphene and ZnO components of the heterojunction.

Figure 13:
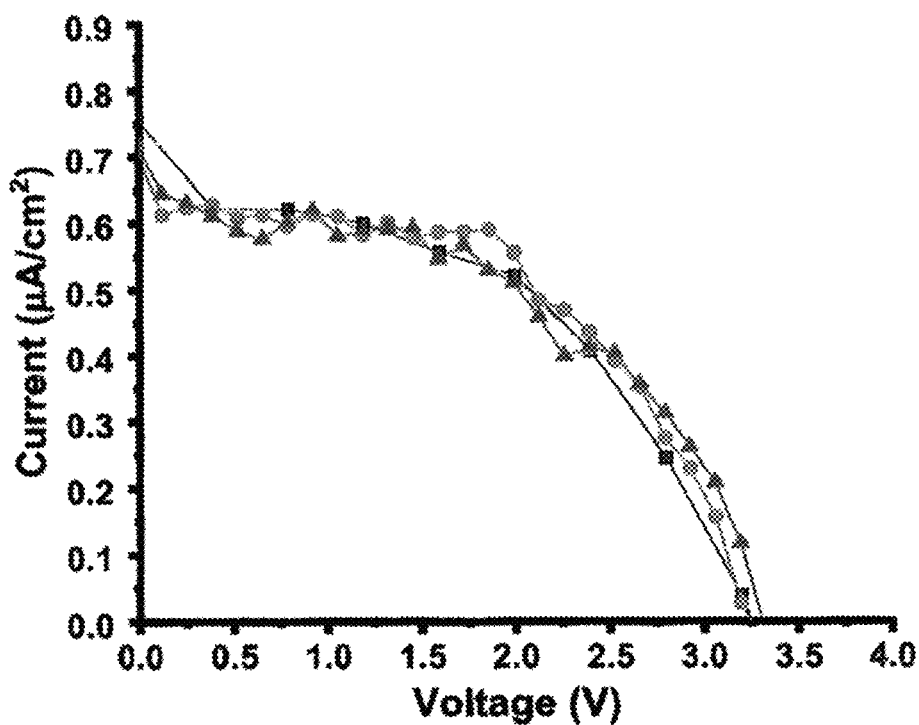
FIG. 13 is a current versus voltage graph for a photovoltaic solar cell having ZnO nanowire cores coated with graphene from a polyaromatic hydrocarbon and using a silver electrode in contact with the graphene.

Further investigations of the effectiveness of the ITO in increasing the photocurrent were performed by constructing a cell having a graphene wrapped ZnO wire array supported on zinc foil, and a patterned silver electrode in place of the ITO electrode of the previously described embodiment. The current density versus voltage profile for this cell is shown in FIG. 13. While the cell displayed an open cell voltage of about 3.2 V, its short circuit current density was significantly lower than that achieved in the cell with ITO corresponding to FIG. 14. The significantly higher current density shown in FIG. 14 is at least partially attributed to the effect of the ITO.

While the principles disclosed herein have been demonstrated with regard to solar cells using ZnO nanowire cores, these teachings are extendable to other wide band gap nanowire materials, for example, boron, titanium, silicon borides, carbides, nitrides, oxides, or sulfides. Wide bandgap material will be understood to refer to a material having a valence band and a conduction band that differ by at least two volts. The materials best suited for generating the highest solar cell potentials are those functioning to contact charge graphene and exhibiting a large attractive potential with graphene so as to catalyze the formation of single layer graphene shells according to the disclosed aromatic hydrocarbon decomposition method. By additionally contact charging of the opposite surface of the graphene shell using an electron donor material as disclosed herein, and the use of a transparent conductive material as an electrode material for the graphene side of the photovoltaic junction, a variety of high voltage solar cells capable of significantly greater conversion efficiencies then previously known designs may be provided.

In summary, energy favorable, surface-based, and radial heterojunction solar cells made up of graphene 2D layer and ZnO 1D nanowires have been disclosed. This novel solar cell architecture has been experimentally shown to be capable of producing an open circuit photovoltage in the range of 2.4 V to 3.5 V under AM 1.5G illumination. While the reported experimental results show short circuit currents in the low milliampere range, the broader teachings herein will enable the production of solar cells having short circuit currents of at least 10 mA, and likely as high as 25 mA. The creation of a solar cell structure displaying an open circuit voltage as high as 3.5 V makes it feasible, with additional optimizations directed to increasing the photocurrent into the range just mentioned, to achieve solar cell energy conversion efficiencies of at least 50%. The upper limit for the conversion efficiency remains at 85% as found determined by non-equilibrium thermo-dynamics. This is far superior to the maximum conversion efficiency of about 20% for commercially available multicrystalline silicon solar cells. Furthermore, the disclosed fabrication methods can be readily deployed in full-scale commercial production at a fraction of the cost of high efficiency multijunction cells based on exotic materials such as gallium arsenide or indium selenide, which are presently available only in low volumes at very high price points.

Techniques to increase the photocurrent of solar cells are known in the art, and other principles for generating higher currents within the embodied solar cell devices have been disclosed herein. For example, as demonstrated in FIGS. 13 and 14, application of the transparent conductor ITO increased the generated photocurrent by three orders of magnitude. Selecting the optimum transparent conducting material, or adding colloidal metal particles to increase the electrical conductivity of the ITO, can yield even higher photocurrents. Optimizing the distribution of the transparent conductive material throughout nanowire array can also improve the results. Annealing of the nanowires to reduce surface defects has also been shown to reduce the cell resistance. Improvements to the annealing process, such as the higher temperature annealing techniques described herein, are also expected to reduce the resistance further and yield higher photocurrents. In addition, controlling the diameter and areal density of the nanowires to optimize the available electron conducting ZnO surface area can increase the current density. One or more of these techniques, or other generally known approaches for enhancing the cell conductivity, will enable the production of high voltage solar cells having comparatively high conversion efficiencies, achieving significantly shorter energy payback times than conventional solar energy systems.

The discovery of cost-effective high conversion efficiency solar cells disclosed herein has enormous beneficial consequences for humanity far into the future. The sun provides enough energy in one hour to satisfy the energy requirements of the entire global population for a year. Cheap solar power will hasten the day when the sun fulfills its destiny to become the global energy source.

In some forms, it was desired to devise a PV cell that lends itself to large scale economical manufacture using non-resource limited environmentally benign materials. In some forms, this may be achieved by employing hydrothermal growth of ZnO nanowires clad with graphene, a pure carbon material. Going from the laboratory sized prototype to large scale development so as to satisfy the world-wide multi-terawatt need for electricity is a challenging engineering task that is not without precedent. In some forms, the features described herein may be suitable for achieving these goals.

The novel PV cells described herein can be flexible and readily conform to surfaces of very complex shapes. It is believed that extremely cost-effective retrofitting of the existing PV plants soon to generate one terawatt of solar electricity can be accomplished. Instead of one terawatt, between three and four terawatts of solar electricity could be produced at very low cost by taking advantage of trillions of dollars already invested in PV installations both as central station plants and as distributed power modules on roof tops.

The flexibility conferred by virtue of using a metal foil substrate opens the door to new markets for PV power generation. For example, the roofs of automobiles may be cited as an obvious application. Other uses and implementations may also be utilized.

Those skilled in the art will recognize that a wide variety of modifications, alterations, and combinations can be made with respect to the above described embodiments without departing from the scope of the invention, and that such modifications, alterations, and combinations are to be viewed as being within the ambit of the inventive concept.

What is claimed is:

1. A method of forming a solar cell, the method comprising the steps of:
   providing a foil substrate;
   forming a plurality of nanowire cores on the foil substrate using a hydrothermal synthesis process, the nanowire cores comprising zinc oxide, wherein at least a majority of the nanowire cores are substantially aligned to one another and extend generally perpendicular to the foil substrate and electrically connected to the foil substrate at a first end of the nanowire cores, the hydrothermal synthesis process forming a substantially continuous coating of a nonconductive material on the foil substrate between the zinc oxide nanowire cores;
   surrounding the plurality of nanowire cores with at least one polyaromatic hydrocarbon;
   forming a plurality of nanowire core/shell structures by thermally converting at least some of the polyaromatic hydrocarbon to form a plurality of shells, each shell comprising graphene and being conformally disposed about a portion of a respective nanowire core to form a photovoltaic junction;
   forming a first conducting electrode electrically connected to the foil substrate and providing a first electrical pathway to facilitate a movement of electrons away from the nanowire cores; and
   forming a second conducting electrode connected to the graphene shells at a second end of the nanowire core/shell structures and providing a second electrical pathway to facilitate a movement of positive charges away from the graphene shells.

2. The photovoltaic solar cell apparatus of according to claim 1, wherein the at least one polyaromatic hydrocarbon comprises at least one of coronene, naphthalene, and terphenyl.

3. The photovoltaic solar cell apparatus according to claim 1, wherein the step of surrounding the plurality of nanowire cores with at least one polyaromatic hydrocarbon comprises at least one of spray coating, drop coating, dip coating or spin coating a solution comprising the at least one polyaromatic hydrocarbon in a solvent.

4. The photovoltaic solar cell apparatus according to claim 3, wherein the step of forming a plurality of nanowire core/shell structures is conducted to remove substantially all of the solvent and thermally decompose the polyaromatic hydrocarbon to form graphene.

5. The photovoltaic solar cell apparatus according to claim 1, characterized in that the photovoltaic solar cell has an open-circuit voltage of between about 1.0 V and 3.6 V when illuminated with $1KW/m^2$ of AM 1.5G irradiation.

6. The photovoltaic solar cell apparatus according to claim 5, characterized in that the photovoltaic solar cell has a short circuit current density of at least 1 $mA/cm^2$ when illuminated with $1KW/m^2$ of AM 1.5G irradiation.

7. The photovoltaic solar cell apparatus according to claim 1, wherein the shells comprise a substantially uniform single layer of graphene.

8. The photovoltaic solar cell apparatus according to claim 1, wherein second conducting electrode is at least partially transparent to sunlight.

9. The photovoltaic solar cell apparatus according to claim 1, wherein a substance effective to decrease the work function of graphene is placed in contact with the graphene shells.

10. The photovoltaic solar cell apparatus according to claim 9, wherein second conducting electrode comprises at least one metal effective to reduce the work function of graphene.

11. The photovoltaic solar cell apparatus according to claim 10, wherein the at least one metal effective to reduce the work function of graphene comprises one or more of silver, aluminum and copper.

12. A method of generating electricity, the method comprising the steps of:
   providing a photovoltaic solar cell, the photovoltaic solar cell comprising:
      a foil substrate consisting essentially of zinc,
      a plurality of nanowire cores on the foil substrate, the nanowire cores comprising zinc oxide, wherein at least a majority of the nanowire cores are substantially aligned to one another and extend generally perpendicular to the foil substrate and electrically connected to the foil substrate at a first end of the nanowire cores,
      a substantially continuous coating of zinc oxide on the foil substrate between the nanowire cores,
      a plurality of shells, each comprising graphene, and each shell being conformally disposed about a portion of a respective nanowire core to form a plurality of nanowire core/shell structures,
      a first conducting electrode electrically connected to the foil substrate and providing a first electrical pathway to facilitate a movement of electrons away from the nanowire cores,
      a second conducting electrode connected to shells at a second end of the nanowire core/shell structures and providing a second electrical pathway to facilitate a movement of positive charges away from the shells, and
      the second conducting electrode comprising a material that is at least partially transparent to sunlight and at least one metal effective to reduce the work function of the shells within at least a portion of the partially transparent material,
   exposing the solar cell to light to cause charge to flow through the solar cell; and
   generating electricity as a result of charge flowing through the solar cell wherein the photovoltaic solar cell has a short circuit current density of at least 1 mA/cm2 when illuminated with 1KW/m2 of AM 1.5G irradiation.

23

13. The method according to claim 12, wherein the shells are formed from at least one polyaromatic hydrocarbon comprising at least one of coronene, naphthalene, and terphenyl.

14. The method according to claim 12, characterized in that the photovoltaic solar cell has an open-circuit voltage of between about 1.0 V and 3.6 V when illuminated with 1KW/m$^2$ of AM 1.5G irradiation.

15. The method according to claim 12, wherein the shells comprise a substantially uniform single layer of graphene.

16. The method according to claim 12, wherein the nanowire cores include a dopant along at least a portion of the longitudinal surface thereof.

17. The method according to claim 12, wherein the at least one metal effective to reduce the work function of graphene comprises one or more of silver, aluminum and copper.

18. The method according to claim 12, wherein the material forming the second conducting electrode is interspersed between the nanowire cores.

19. The method according to claim 12, wherein second conducting electrode comprises indium tin oxide containing particles of silver.

20. A method of generating electricity, the method comprising the steps of:
  providing a photovoltaic solar cell, the photovoltaic solar cell having been prepared by a method comprising:
    providing a foil substrate,
    forming a plurality of nanowire cores on the foil substrate using a hydrothermal synthesis process, the nanowire cores comprising zinc oxide, wherein at least a majority of the nanowire cores are substantially aligned to one another and extend generally perpendicular to the foil substrate and electrically connected to the foil substrate at a first end of the nanowire cores, the hydrothermal synthesis process forming a substantially continuous coating of a non-conductive material on the foil substrate between the zinc oxide nanowire cores,
    surrounding the plurality of nanowire cores with at least one polyaromatic hydrocarbon,
    forming a plurality of nanowire core/shell structures by maintaining the nanowire cores and polyaromatic hydrocarbon under conditions sufficient to thermally convert at least some of the polyaromatic hydrocarbon to form a plurality of shells, each shell comprising graphene and being conformally disposed about a portion of a respective nanowire core to form a photovoltaic junction,
    forming a first conducting electrode electrically connected to the foil substrate and providing a first electrical pathway to facilitate a movement of electrons away from the nanowire cores, and
    forming a second conducting electrode connected to the graphene shells at a second end of the nanowire core/shell structures and providing a second electrical pathway to facilitate a movement of positive charges away from the graphene shells,
  exposing the solar cell to light to cause charge to flow through the solar cell; and
  generating electricity as a result of charge flowing through the solar cell wherein the photovoltaic solar cell has a short circuit current density of at least 1 mA/cm2 when illuminated with 1KW/m2 of AM 1.5G irradiation.

21. The method according to claim 20, wherein the shells are formed from at least one polyaromatic hydrocarbon comprising at least one of coronene, naphthalene, and terphenyl.

22. The method according to claim 20, characterized in that the photovoltaic solar cell has an open-circuit voltage of between about 1.0 V and 3.6 V when illuminated with 1KW/m$^2$ of AM 1.5G irradiation.

23. The method according to claim 20, wherein the shells comprise a substantially uniform single layer of graphene.

24. The method according to claim 20, wherein the nanowire cores include a dopant along at least a portion of the longitudinal surface thereof.

25. The method according to claim 20, wherein the at least one metal effective to reduce the work function of graphene comprises one or more of silver, aluminum and copper.

26. The method according to claim 20, wherein the material forming the second conducting electrode is interspersed between the nanowire cores.

27. The method according to claim 20, wherein second conducting electrode comprises indium tin oxide containing particles of silver.

* * * * *